United States Patent
Nakayama et al.

(10) Patent No.: US 8,076,947 B2
(45) Date of Patent: Dec. 13, 2011

(54) DEVICE, METHOD, PROGRAM, AND RECORDING MEDIUM FOR ERROR FACTOR DETERMINATION, AND OUTPUT CORRECTION DEVICE AND REFLECTION COEFFICIENT MEASUREMENT DEVICE PROVIDED WITH THE DEVICE

(75) Inventors: Yoshikazu Nakayama, Saitama (JP); Masato Haruta, Saitama (JP); Hiroyuki Sekine, Saitama (JP)

(73) Assignee: Advantest Corporation, Tokyo (JP)

( * ) Notice: Subject to any disclaimer, the term of this patent is extended or adjusted under 35 U.S.C. 154(b) by 453 days.

(21) Appl. No.: 12/377,430

(22) PCT Filed: Aug. 15, 2007

(86) PCT No.: PCT/JP2007/066221
§ 371 (c)(1),
(2), (4) Date: May 4, 2009

(87) PCT Pub. No.: WO2008/026483
PCT Pub. Date: Mar. 6, 2008

(65) Prior Publication Data
US 2010/0225301 A1 Sep. 9, 2010

(30) Foreign Application Priority Data
Aug. 31, 2006 (JP) .................. 2006-235156

(51) Int. Cl.
*G01R 15/00* (2006.01)
(52) U.S. Cl. .......................... 324/601; 702/90
(58) Field of Classification Search ............ 324/601, 324/76.11; 702/85, 90
See application file for complete search history.

(56) References Cited

U.S. PATENT DOCUMENTS

| | | | |
|---|---|---|---|
| 2004/0100276 A1* | 5/2004 | Fanton | 324/601 |
| 2005/0165570 A1 | 7/2005 | Wakai | |
| 2005/0289392 A1 | 12/2005 | Haruta et al. | |
| 2007/0029989 A1 | 2/2007 | Nakayama et al. | |
| 2007/0143051 A1 | 6/2007 | Nakayama | |
| 2007/0285108 A1 | 12/2007 | Nakayama et al. | |
| 2009/0030633 A1 | 1/2009 | Nakayama | |
| 2009/0031172 A1 | 1/2009 | Nakayama | |

FOREIGN PATENT DOCUMENTS

JP 11-38054 2/1999
(Continued)

OTHER PUBLICATIONS

English language Abstract of JP 2005-233883, Sep. 2, 2005. English language Abstract of JP 2003-344255, Dec. 3, 2003.

(Continued)

*Primary Examiner* — Vincent Q Nguyen
(74) *Attorney, Agent, or Firm* — Greenblum & Bernstein, P.L.C.

(57) ABSTRACT

An error factor determination device includes an error factor recording unit which records error factors Eija in a signal generation system which includes a signal generation unit for generating a signal and an output terminal for outputting the signal, a reflection coefficient deriving unit which derives a reflection coefficient Xm of the output terminal based on measurement results R1 and R2 of the signal while the signal is being output from the output terminal and the error factors Eija recorded in the error factor recording unit, and a true/false determination unit which determines whether the recorded error factors Eija are true or false based on the derived reflection coefficient Xm, and a true value of the reflection coefficient.

20 Claims, 27 Drawing Sheets

FOREIGN PATENT DOCUMENTS

| | | |
|---|---|---|
| JP | 2003-294820 | 10/2003 |
| JP | 2003-344255 | 12/2003 |
| JP | 2005-233883 | 9/2005 |
| TW | 200513654 | 4/2005 |
| TW | 200533931 | 10/2005 |
| WO | 2004/049564 | 6/2004 |

OTHER PUBLICATIONS

English language Abstract of JP 11-38054, Feb. 12, 1999.
English language translation of JP 2005-233883, Sep. 2, 2005.
English language translation of JP 2003-344255, Dec. 3, 2003.
English language translation of JP 11-38054, Feb. 12, 1999.

* cited by examiner

DEVICE, METHOD, PROGRAM, AND RECORDING MEDIUM FOR ERROR FACTOR DETERMINATION, AND OUTPUT CORRECTION DEVICE AND REFLECTION COEFFICIENT MEASUREMENT DEVICE PROVIDED WITH THE DEVICE

TECHNICAL FIELD

The present invention relates to a calibration for a switch-branch signal source constructed by combining a signal source which generates a signal, and a switch which outputs the generated signal to any of multiple ports.

BACKGROUND ART

Conventionally, there have been measured circuit parameters (such as the S parameters) of a device under test (DUT) (refer to Patent Document 1: Japanese Laid-Open Patent Publication No. H11-38054, for example).

Specifically, a signal is transmitted from a signal source to a receiving unit via the DUT. The signal is received by the receiving unit. It is possible to acquire the S parameters and frequency characteristics of the DUT by measuring the signal received by the receiving unit.

On this occasion, measurement system errors are generated in the measurement due to mismatching between a measurement system such as the signal source and the DUT, and the like. These measurement system errors include Ed: error caused by the direction of bridges, Er: error caused by frequency tracking, and Es: error caused by source matching.

On this occasion, it is possible to correct the errors according to Patent Document 1, for example. The correction in this way is referred to as calibration. A brief description will now be given of the calibration. Calibration kits are connected to the signal source to realize three types of states: open, short-circuit, and load (standard load Z0). In these states, a signal reflected from the respective calibration kits is acquired by a bridge to obtain three types of the S parameter corresponding to the three types of state. The three types of variable Ed, Er, and Es are acquired from the three types of the S parameter, and then are corrected.

It should be noted that Er is represented as a product of an error Er1 relating to an input of a signal, and an error Er2 relating to a reflection of the signal. On this occasion, it is possible to connect a power meter to the signal source to measure the power, thereby measuring the errors Er1 and Er2 (refer to Patent Document 2: WO 2004/049564 pamphlet, for example).

The calibration described above can be applied to a switch-branch signal source. It should be noted that the switch-branch signal source is a combination of a signal source which generates a signal, and a switch which outputs the generated signal to any of multiple ports. If the above calibration is applied to a switch-branch signal source, the three states including the open state, the short-circuit state, and the load state (with the standard load of Z0) will be realized for the respective multiple ports, and a power meter is also connected according to necessity.

On this occasion, it is troublesome to measure Ed, Er1, Er2, and Es each time when circuit parameters of a DUT are measured. Therefore, it is desirable to record Ed, Er1, Er2, and Es measured at a certain time, and to correct circuit parameters of a DUT using the recorded Ed, Er1, Er2, and Es each time the circuit parameters are measured.

However, a secular change or a failure of a measurement system has possibly occurred between the time point when Ed, Er1, Er2, and Es were measured and the time point when the circuit parameters of the DUT are measured. A secular change or a failure of the measurement system may cause a change in Ed, Er1, Er2, and Es after they were measured. In this case, the correction using the recorded Ed, Er1, Er2, and Es cannot be precise correction.

When the circuit parameters of the DUT are measured, it can be determined whether Ed, Er1, Er2, and Es have been changed or not since they were measured by actually measuring Ed, Er1, Er2, and Es. However, in this case, it is not possible to avoid the trouble of actually measuring Ed, Er1, Er2, and Es.

It is an object of the present invention to easily carry out the calibration of a signal generation system such as a switch-branch signal source.

DISCLOSURE OF THE INVENTION

According to the present invention, an error factor determination device includes: an error factor recording unit that records an error factor in a signal generation system which includes a signal generation unit for generating a signal, and an output terminal for outputting the signal; a reflection coefficient deriving unit that derives a reflection coefficient of the output terminal based on a measurement result of the signal while the signal is being output from the output terminal, and the error factor recorded in the error factor recording unit; and a true/false determination unit that determines whether the recorded error factor is true or false based on the derived reflection coefficient, and a true value of the reflection coefficient.

According to the thus constructed error factor determination device, an error factor recording unit records an error factor in a signal generation system which includes a signal generation unit for generating a signal, and an output terminal for outputting the signal. A reflection coefficient deriving unit derives a reflection coefficient of the output terminal based on a measurement result of the signal while the signal is being output from the output terminal, and the error factor recorded in the error factor recording unit. A true/false determination unit determines whether the recorded error factor is true or false based on the derived reflection coefficient, and a true value of the reflection coefficient.

According to the present invention, an error factor determination device includes: an error factor recording unit that records an error factor in a signal generation system which includes a signal generation unit for generating a signal and a plurality of output terminals for outputting the signal; a reflection coefficient deriving unit that derives respective reflection coefficients of the plurality of output terminals based on a measurement result of the signal while the signal is being output from the output terminal, and the error factor recorded in the error factor recording unit; and a true/false determination unit that determines whether the recorded error factor is true or false based on the derived reflection coefficients coincide with each other, wherein the measurement result of the signal is acquired when the respective reflection coefficients of the plurality of the output terminals coincide with each other.

According to the thus constructed error factor determination device, an error factor recording unit records an error factor in a signal generation system which includes a signal generation unit for generating a signal and a plurality of output terminals for outputting the signal. A reflection coefficient deriving unit derives respective reflection coefficients of the plurality of output terminals based on a measurement result of the signal while the signal is being output from the output terminal, and the error factor recorded in the error factor recording unit. A true/false determination unit determines whether the recorded error factor is true or false based on the derived reflection coefficients coincide with each other. The measurement result of the signal is acquired when the respective reflection coefficients of the plurality of the output terminals coincide with each other.

According to the present invention, an error factor determination device includes: an error factor recording unit that records an error factor in a signal generation system which includes a plurality of signal generation units for generating a signal and a single output terminal for outputting the signal; a reflection coefficient deriving unit that derives a reflection coefficient of the output terminal respectively for the plurality of signal generation units based on a measurement result of the signal while the signal is being output from the output terminal, and the error factor recorded in the error factor recording unit; and a true/false determination unit that determines whether the recorded error factor is true or false based on the derived reflection coefficients coincide with each other.

According to the thus constructed an error factor determination device, an error factor recording unit records an error factor in a signal generation system which includes a plurality of signal generation units for generating a signal and a single output terminal for outputting the signal. A reflection coefficient deriving unit derives a reflection coefficient of the output terminal respectively for the plurality of signal generation units based on a measurement result of the signal while the signal is being output from the output terminal, and the error factor recorded in the error factor recording unit. A true/false determination unit determines whether the recorded error factor is true or false based on the derived reflection coefficients coincide with each other.

According to the error factor determination device of the present invention, the measurement result of the signal may include a measurement result of the signal before the error factor is generated and a measurement result of a reflection of the signal.

According to the error factor determination device of the present invention, the signal may be measured while a calibration tool is connected to the output terminal; and the calibration tool may realize any of states including an open state, a short-circuit state, a standard load state, and an arbitrary load state.

According to the error factor determination device of the present invention, the signal generation system may include an amplifier which amplifies the signal, the error factor determination device including: an amplification factor recording unit which records an amplification factor of the amplifier; an amplification factor deriving unit that derives the amplification factor based on the measurement result of the signal while the signal is being output from the output terminal and a power of the signal; and an amplification factor true/false determination unit that determines whether the recorded amplification factor is true or false based on the recorded amplification factor and the derived amplification factor.

According to the error factor determination device of the present invention, the true/false determination unit may advise a measurement of the error factor, or report a failure of the signal generation system based on a result of determining whether the recorded error factor is true or false.

According to the error factor determination device of the present invention, the plurality of output terminals may be of the same type; and the signal may be measured while the plurality of output terminals are in a non-connection state.

According to the error factor determination device of the present invention, the signal may be measured while the same calibration tool is connected to the plurality of output terminals; and the calibration tool may realize any of states including an open state, a short-circuit state, a standard load state, and an arbitrary load state.

An output correction device according to the present invention may include the error factor determination device according to the present invention and a signal power adjustment unit that adjusts a power of the signal based on the error factor determined as true by the true/false determination unit.

A reflection coefficient measurement device according to the present invention may include: the error factor determination device according to the present invention; and a reflection coefficient measurement unit that measures a reflection coefficient of a device under test based on a result of a measurement of the signal before the error factor is generated, a result of a measurement of a reflection of the signal, and the error factor determined as true by the true/false determination unit while the device under test is connected to the output terminal.

According to the present invention, an error factor determination method includes: an error factor recording step that records an error factor in a signal generation system which includes a signal generation unit for generating a signal, and an output terminal for outputting the signal; a reflection coefficient deriving step that derives a reflection coefficient of the output terminal based on a measurement result of the signal while the signal is being output from the output terminal, and the error factor recorded in the error factor recording step; and a true/false determination step that determines whether the recorded error factor is true or false based on the derived reflection coefficient, and a true value of the reflection coefficient.

According to the present invention, an error factor determination method includes: an error factor recording step that records an error factor in a signal generation system which includes a signal generation unit for generating a signal and a plurality of output terminals for outputting the signal; a reflection coefficient deriving step that derives respective reflection coefficients of the plurality of output terminals based on a measurement result of the signal while the signal is being output from the output terminal, and the error factor recorded in the error factor recording step; and a true/false determination step that determines whether the recorded error factor is true or false based on the derived reflection coefficients coincide with each other, wherein the measurement result of the signal is acquired when the respective reflection coefficients of the plurality of the output terminals coincide with each other.

According to the present invention, an error factor determination method includes: an error factor recording step that records an error factor in a signal generation system which includes a plurality of signal generation units for generating a signal and a single output terminal for outputting the signal; a reflection coefficient deriving step that derives a reflection coefficient of the output terminal respectively for the plurality of signal generation units based on a measurement result of the signal while the signal is being output from the output terminal, and the error factor recorded in the error factor recording step; and a true/false determination step that determines whether the recorded error factor is true or false based on the derived reflection coefficients coincide with each other.

The present invention is a program of instructions for execution by the computer to perform an error factor determination process including: an error factor recording step that records an error factor in a signal generation system which includes a signal generation unit for generating a signal, and an output terminal for outputting the signal; a reflection coefficient deriving step that derives a reflection coefficient of the output terminal based on a measurement result of the signal while the signal is being output from the output terminal, and the error factor recorded in the error factor recording step; and a true/false determination step that determines whether the recorded error factor is true or false based on the derived reflection coefficient, and a true value of the reflection coefficient.

The present invention is a program of instructions for execution by the computer to perform an error factor determination process including: an error factor recording step that records an error factor in a signal generation system which includes a signal generation unit for generating a signal and a plurality of output terminals for outputting the signal; a reflection coefficient deriving step that derives respective reflection coefficients of the plurality of output terminals based on a measurement result of the signal while the signal is being output from the output terminal, and the error factor recorded in the error factor recording step; and a true/false determination step that determines whether the recorded error factor is true or false based on the derived reflection coefficients coincide with each other, wherein the measurement result of the signal is acquired when the respective reflection coefficients of the plurality of the output terminals coincide with each other.

The present invention is a program of instructions for execution by the computer to perform an error factor determination process including: an error factor recording step that records an error factor in a signal generation system which includes a plurality of signal generation units for generating a signal and a single output terminal for outputting the signal; a reflection coefficient deriving step that derives a reflection coefficient of the output terminal respectively for the plurality of signal generation units based on a measurement result of the signal while the signal is being output from the output terminal, and the error factor recorded in the error factor recording step; and a true/false determination step that determines whether the recorded error factor is true or false based on the derived reflection coefficients coincide with each other.

The present invention is a computer-readable medium having a program of instructions for execution by the computer to perform an error factor determination process including: an error factor recording step that records an error factor in a signal generation system which includes a signal generation unit, and an output terminal for outputting the signal; a reflection coefficient deriving step that derives a reflection coefficient of the output terminal based on a measurement result of the signal while the signal is being output from the output terminal, and the error factor recorded in the error factor recording step; and a true/false determination step that determines whether the recorded error factor is true or false based on the derived reflection coefficient, and a true value of the reflection coefficient.

The present invention is a computer-readable medium having a program of instructions for execution by the computer to perform an error factor determination process including: an error factor recording step that records an error factor in a signal generation system which includes a signal generation unit for generating a signal and a plurality of output terminals for outputting the signal; a reflection coefficient deriving step that derives respective reflection coefficients of the plurality of output terminals based on a measurement result of the signal while the signal is being output from the output terminal, and the error factor recorded in the error factor recording step; and a true/false determination step that determines whether the recorded error factor is true or false based on the derived reflection coefficients coincide with each other, wherein the measurement result of the signal is acquired when the respective reflection coefficients of the plurality of the output terminals coincide with each other.

The present invention is a computer-readable medium having a program of instructions for execution by the computer to perform an error factor determination process including: an error factor recording step that records an error factor in a signal generation system which includes a plurality of signal generation units for generating a signal and a single output terminal for outputting the signal; a reflection coefficient deriving step that derives a reflection coefficient of the output terminal respectively for the plurality of signal generation units based on a measurement result of the signal while the signal is being output from the output terminal, and the error factor recorded in the error factor recording step; and a true/false determination step that determines whether the recorded error factor is true or false based on the derived reflection coefficients coincide with each other.

BEST MODE FOR CARRYING OUT THE INVENTION

A description will now be given of embodiments of the present invention with reference to drawings.

First Embodiment

Figure 1:
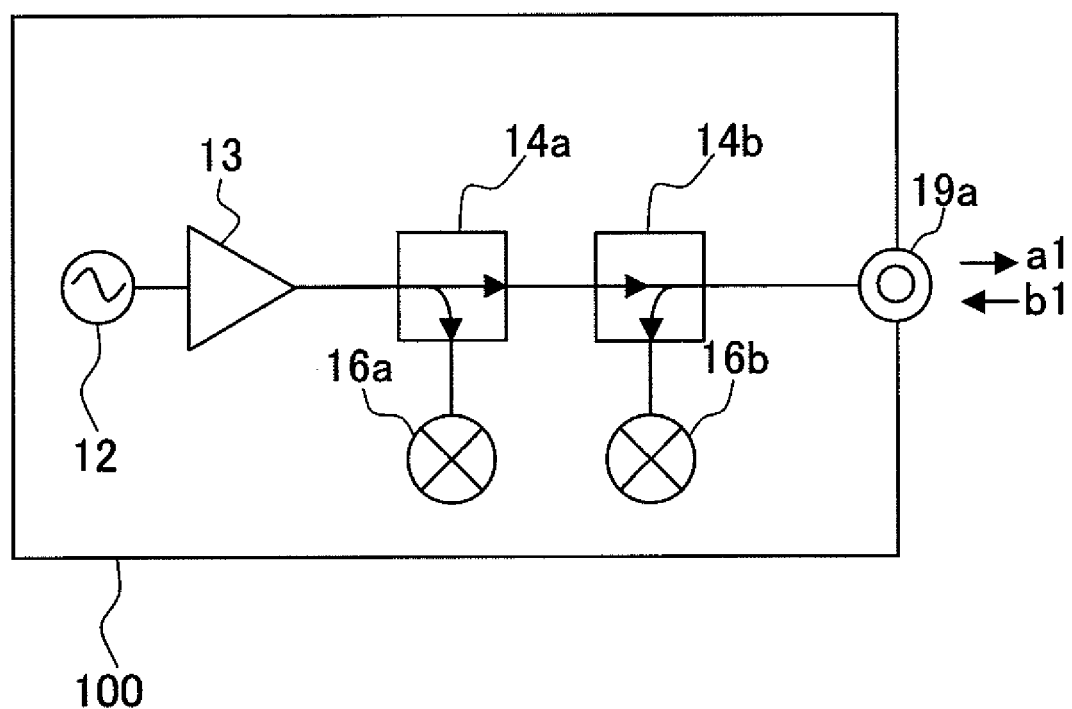
FIG. 1 shows a configuration of a signal generation system 100 according to a first embodiment.

FIG. 1 shows a configuration of a signal generation system 100 according to a first embodiment. The signal generation system 100 includes a signal generation unit 12, an amplifier 13, bridges 14a and 14b, mixers 16a and 16b, and an output terminal 19a.

The signal generation unit 12 generates a signal (such as a high frequency signal). The amplifier 13 amplifies the signal generated by the signal generation unit 12.

The bridge 14a receives the output of the amplifier 13, and branches the output into two directions. The mixer 16a receives one of the outputs of the bridge 14a, and multiplies it by a local signal with a predetermined local frequency. It should be noted that the local signal is not illustrated. An output of the mixer 16a can be considered as a result of a measurement of the signal before error factors in the signal generation system 100 are generated.

The bridge 14b receives and directly outputs the other one of the outputs of the bridge 14a. It should be noted that the bridge 14b receives a reflection of the signal (reflected signal) coming from the output side, and supplies the mixer 16b with the reflected signal. The mixer 16b multiplies the reflected signal and a local signal by each other. It should be noted that the local signal is not illustrated. The output of the mixer 16b can be considered as a result of a measurement of the reflected signal. Since the reflected signal is a reflection of the signal coming from the output side, the result of the measurement of the reflected signal can also be considered as a result of a measurement of the signal.

The signal is output from the output terminal 19a. On this occasion, an S parameter of the output from the output terminal 19a is denoted by a1, and an S parameter of the reflection of the output coming back to the output terminal 19a is denoted by b1.

Figure 2:
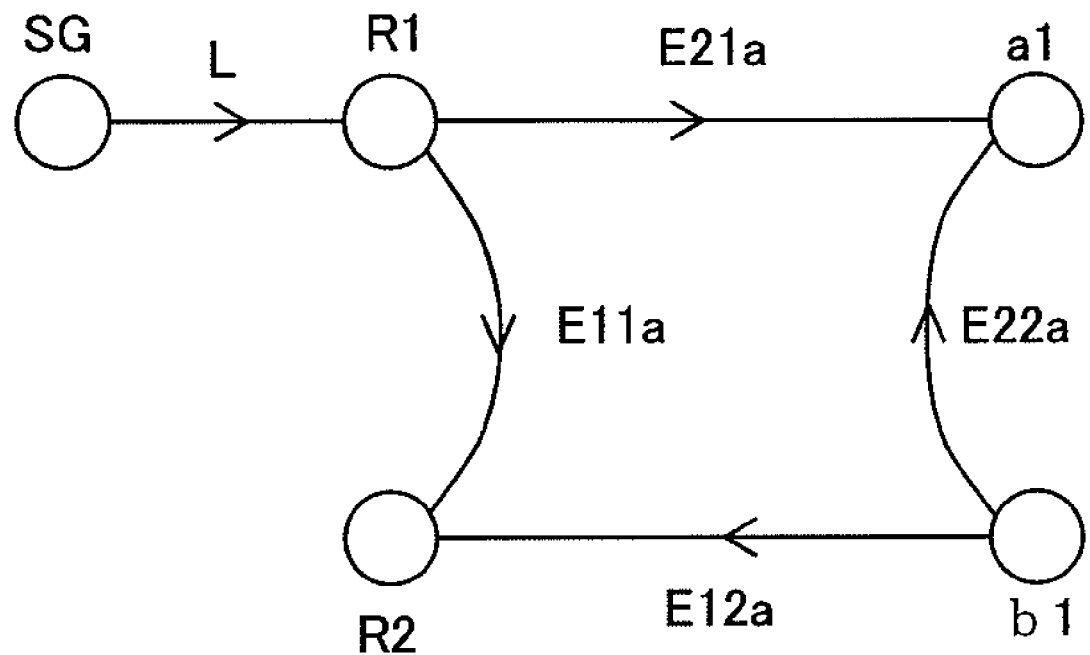
FIG. 2 is a signal flow graph of the signal generation system 100 according to the first embodiment.

FIG. 2 is a signal flow graph of the signal generation system 100 according to the first embodiment.

In FIG. 2, SG denotes the output of the signal generation unit 12, R1 denotes the output of the mixer 16a, and R2 denotes the output of the mixer 16b. Moreover, there holds a relationship: R1=SG×L as shown in FIG. 2, where L (S parameter) is an amplification factor of the amplifier 13.

Referring to FIG. 2, it is observed that error factors E11a, E12a, E21a, and E22a (S parameters) are generated in the signal generation system 100.

Figure 3:
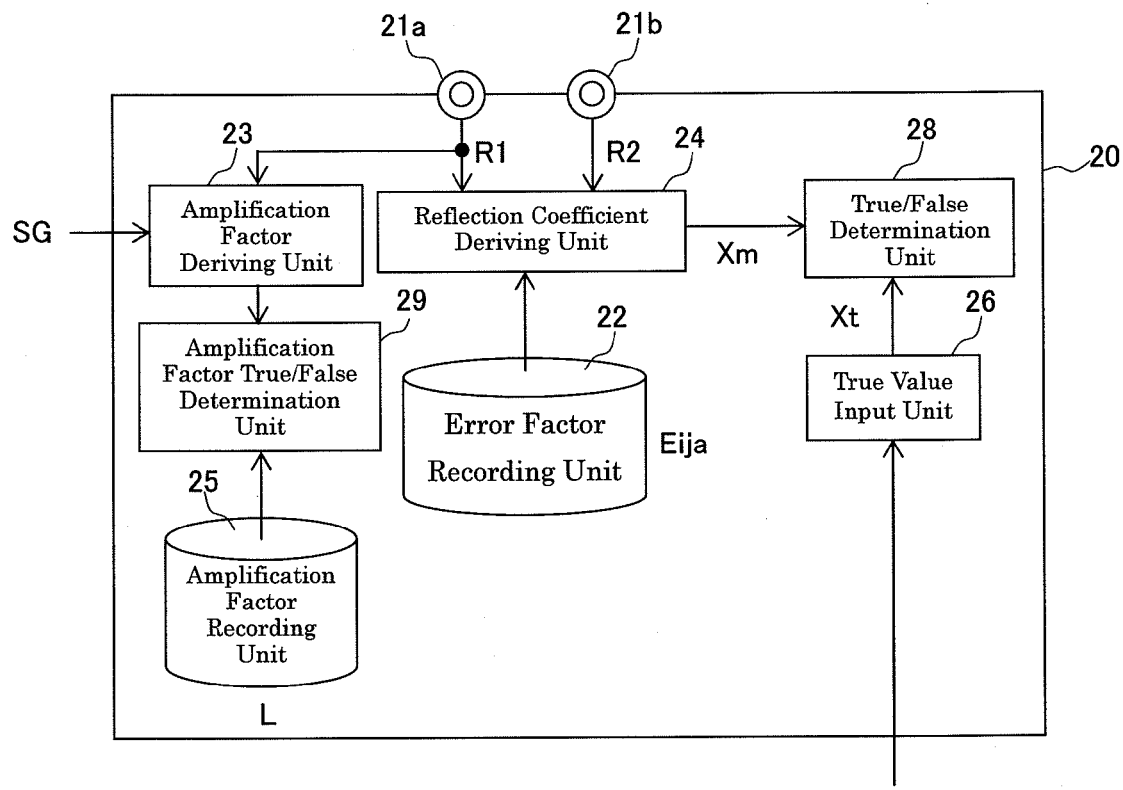
FIG. 3 is a functional block diagram showing a configuration of an error factor determination device 20 according to the first embodiment.

FIG. 3 is a functional block diagram showing a configuration of an error factor determination device 20 according to the first embodiment. The error factor determination device 20 includes terminals 21a and 21b, an error factor recording unit 22, an amplification factor deriving unit 23, a reflection coefficient deriving unit 24, an amplification factor recording unit 25, a true value input unit 26, a true/false determination unit 28, and an amplification factor true/false determination unit 29.

The terminal 21a is a terminal which is connected to the mixer 16a of the signal generation system 100. The terminal 21b is a terminal which is connected to the mixer 16b of the signal generation system 100.

The error factor recording unit 22 records the error factors E11a, E12a, E21a, and E22a of the signal generation system 100. On this occasion, the error factors E11a, E12a, E21a, and E22a are denoted by Eija (i=1 or 2, j=1 or 2).

The amplification factor deriving unit 23 derives the amplification factor L as L=R1/SG based on the measurement result R1 of the signal and the power SG of the signal while the signal is being output from the output terminal 19a. It should be noted that the value of the power SG of the signal is fed to the amplification factor deriving unit 23 from the outside of the error factor determination device 20. Moreover, the measurement result R1 of the signal is fed to the amplification factor deriving unit 23 via the terminal 21a.

The amplification factor recording unit 25 records the amplification factor of the amplifier 13.

The true value input unit 26 inputs a true value Xt of the reflection coefficient of the output terminal 19a. It should be noted that the true value Xt of the reflection coefficient of the output terminal 19a has been known before the signal is measured.

The true/false determination unit 28 determines whether the error factors Eija recorded in the error factor recording unit 22 are true or false based on a reflection coefficient Xm derived by the reflection coefficient deriving unit 24, and the true value Xt of the reflection coefficient. Specifically, if Xm and Xt coincide with each other, the true/false determination unit 28 determines that the error factors Eija are true. The true/false determination unit 28, upon determining that the error factors Eija are false, advises a measurement of the error factors Eija or reports a failure of the signal generation system 100. For example, even if the true/false determination unit 28 determines that the error factors Eija are false, but a difference between Xm and Xt is within a predetermined range, the true/false determination unit 28 determines that this is caused by a secular change of the signal generation system 100, and advises the measurement of the error factors Eija. For example, if the true/false determination unit 28 determines that the error factors Eija are false, and the difference between Xm and Xt exceeds the predetermined range, the true/false determination unit 28 determines that this is caused by a failure of the signal generation system 100, and reports so.

It should be noted that the case in which Xm and Xt coincide with each other implies a case in which Xm=Xt. However, even if Xm=Xt does not hold, but the difference between Xm and Xt is within the permissible range, it is considered that Xm and Xt coincide with each other.

The amplification factor true/false determination unit 29 determines whether the recorded amplification factor is true or false based on the amplification factor recorded in the amplification factor recording unit 25 and the amplification factor derived by the amplification factor deriving unit 23. If the recorded amplification factor and the derived amplification factor coincide with each other (equal to each other), the amplification factor true/false determination unit 29 determines that the amplification factor recorded in the amplification factor recording unit 25 is true. The amplification factor true/false determination unit 29, upon determining that the recorded amplification factor is false, advises a measurement of the recorded amplification factor or reports a failure of the signal generation system 100. For example, even if the amplification factor true/false determination unit 29 determines that the recorded amplification factor is false, but if a difference between both of them is within a predetermined range, the amplification factor true/false determination unit 29 determines that this is caused by a secular change of the signal generation system 100, and advises the measurement of the amplification factor (or possibly advises to record the derived amplification factor in the amplification factor recording unit 25). Moreover, for example, if the amplification factor true/false determination unit 29 determines that the recorded amplification factor is false, and the difference between both of them exceeds the predetermined range, the amplification factor true/false determination unit 29 determines that this is caused by a failure of the signal generation system 100, and reports so.

Even if the recorded amplification factor is not equal to the derived amplification factor, but if the difference between both of them is within the permissible range, it is considered that the recorded amplification factor and the derived amplification factor coincide with each other.

The reflection coefficient deriving unit 24 receives the measurement results R1 and R2 of the signal via the terminals 21a and 21b in the state in which the signal is output from the output terminal 19a of the signal generation system 100.

Figure 4:
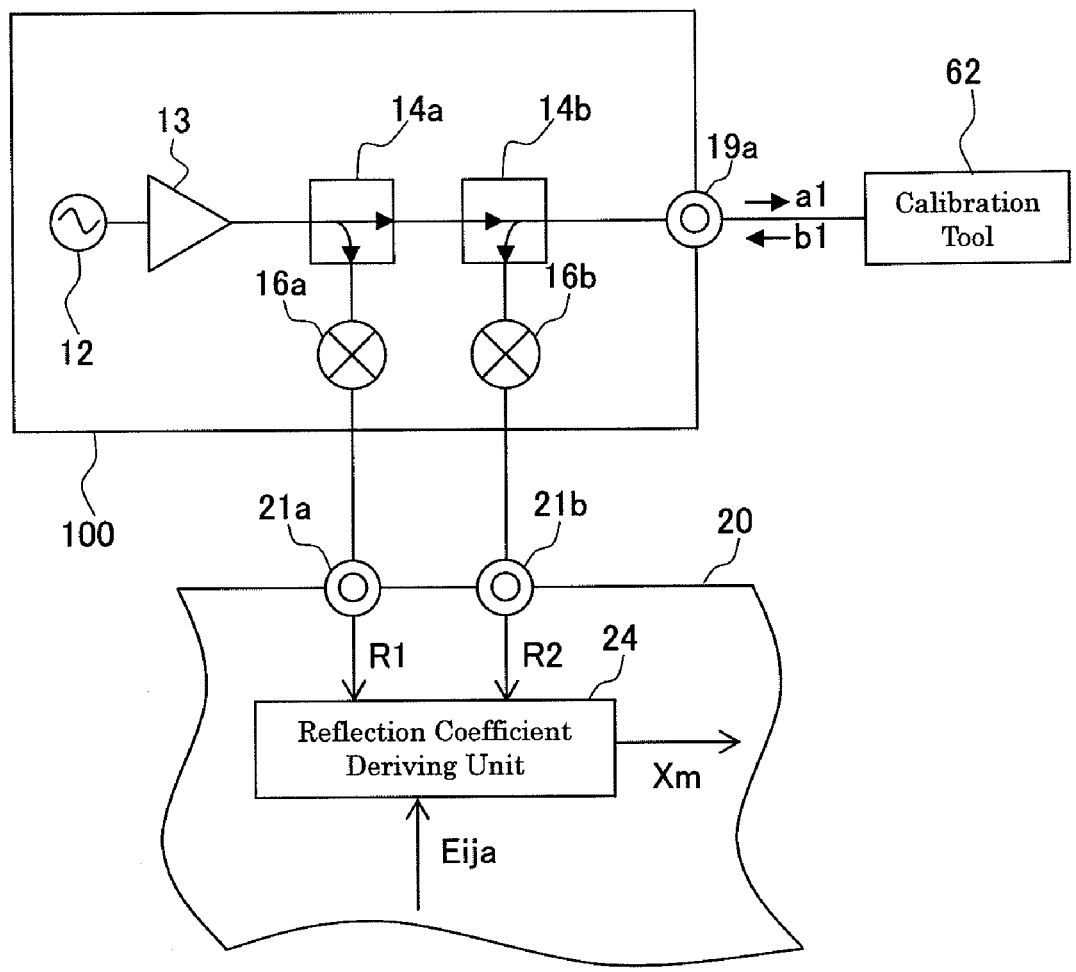
FIG. 4 shows the state in which the calibration tool 62 is connected to the output terminal 19a, and the mixers 16a and 16b are respectively connected to the terminals 21a and 21b.

Referring to FIG. 4, a brief description will be given of what measurement results the terminals 21a and 21b receive. With reference to FIG. 4, while the signal is output from the output terminal 19a, and a calibration tool 62 (open, short-circuit, standard load, or arbitrary load) is connected to the output terminal 19a, the terminals 21a and 21b respectively receive the measurement result of the signal (before the error factors Eija are generated) and the reflected signal (signal reflected by the calibration tool 62). Although the calibration tool 62 is connected to the output terminal 19a in the example shown in FIG. 4, none may be connected to the output terminal 19a (non-connection state). The non-connection state is realized more easily than the case in which the calibration tool 62 is connected, and the non-connection state is more prefer ably realized. It should be noted that the change in phase caused by the reflection is zero in the non-connection state.

Moreover, the calibration tool 62 (short-circuit) realizes a short-circuit state (reflection coefficient 1: total reflection). In this case, the change in phase caused by the reflection is 180 degrees. The calibration tool 62 (standard load) means that the calibration tool 62 has a standard load which realizes a state in which the reflection coefficient is zero. The calibration tool 62 (arbitrary load) means that the calibration tool 62 has a load for which the impedance cannot be matched.

Further, the reflection coefficient deriving unit 24 derives the reflection coefficient Xm of the output terminal 19a based on the measurement results R1 and R2 of the signal and the error factors Eija recorded in the error factor recording unit 22.

Figure 22:
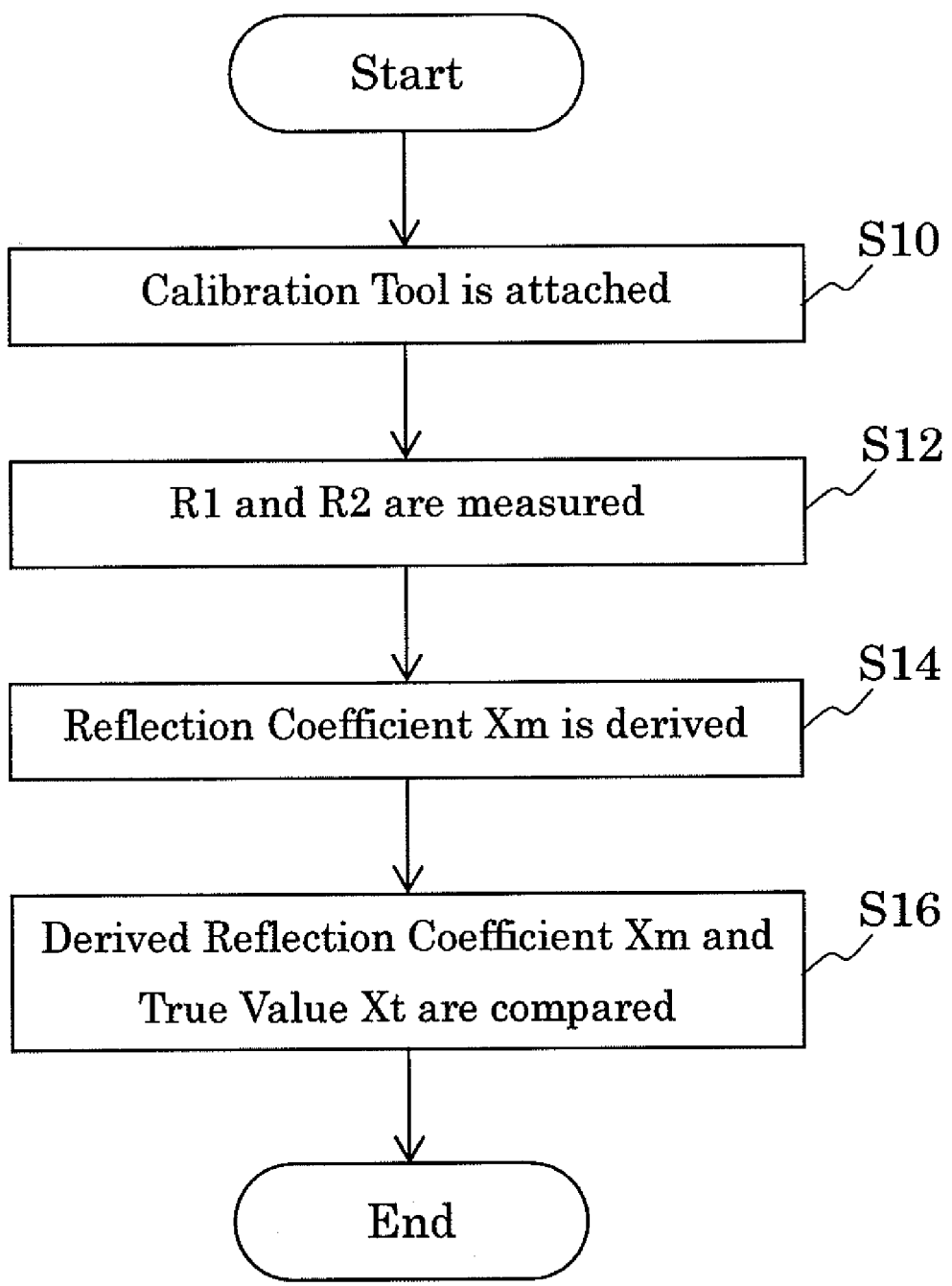
FIG. 22 is a flowchart showing an operation of the error factor determination device 20 according to the first embodiment.
Figure 23:
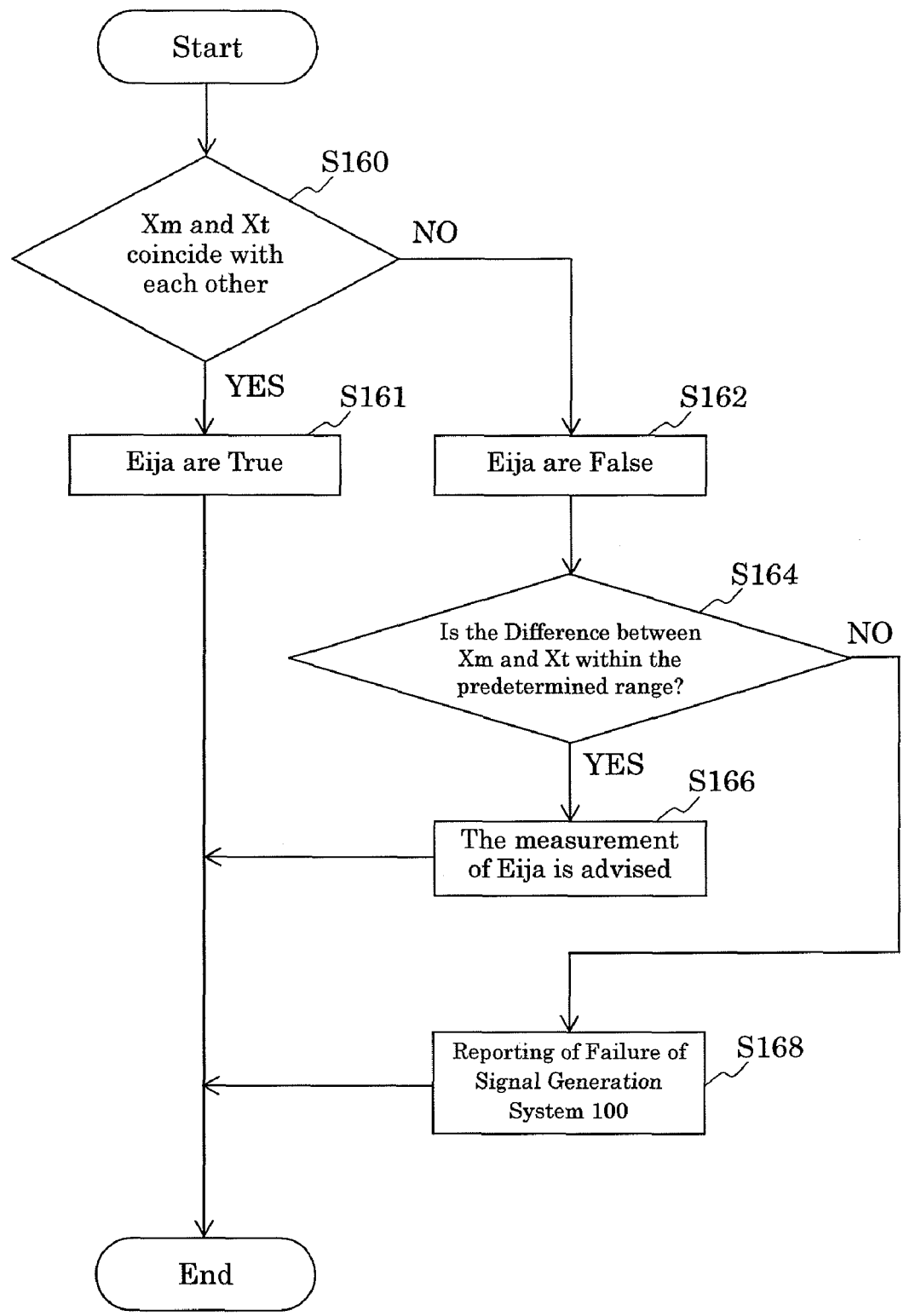
FIG. 23 is a flowchart showing an operation of the true/false determination unit 28 of the error factor determination device 20 according to the first embodiment.

A description will now be given of an operation of the first embodiment with reference to flowcharts in FIGS. 22 and 23. FIG. 22 is a flowchart showing an operation of the error factor determination device 20 according to the first embodiment. FIG. 23 is a flowchart showing an operation of the true/false determination unit 28 of the error factor determination device 20 according to the first embodiment.

First, the calibration tool 62 is attached to the output terminal 19a of the signal generation system 100 (S10). Moreover, the mixer 16a of the signal generation system 100 is connected to the terminal 21a of the error factor determination device 20, and the mixer 16b of the signal generation system 100 is connected to the terminal 21b of the error factor determination device 20.

FIG. 4 shows the state in which the calibration tool 62 is connected to the output terminal 19a, and the mixers 16a and 16b are respectively connected to the terminals 21a and 21b. It should be noted that components other than the terminals 21a and 21b of the error factor determination device 20, and the reflection coefficient deriving unit 24 are not shown in FIG. 4. R1 is a measurement result of the signal before the error factors Eija are generated. R2 is a measurement result of the reflected signal. R1 and R2 are the measurement results of the signal.

It should be noted that the reflected signal is a resulting signal (b1) which is the signal (a1) output from the output terminal 19a and then reflected by the calibration tool 62. Moreover, the signal (b1) reflected by the calibration tool 62 is fed to the bridge 14b. The reflected signal fed to the bridge 14b is fed to the mixer 16b, and is multiplied by the local signal. The output of the mixer 16b is R2.

Moreover, the signal before the error factors Eija are generated is fed to the bridge 14a. The signal fed to the bridge 14a is fed to the mixer 16a, and is multiplied by the local signal. The output of the mixer 16a is R1.

In this way, R1 and R2 are measured (S12).

The measured outputs R1 and R2 are fed to the reflection coefficient deriving unit 24.

Figure 5:
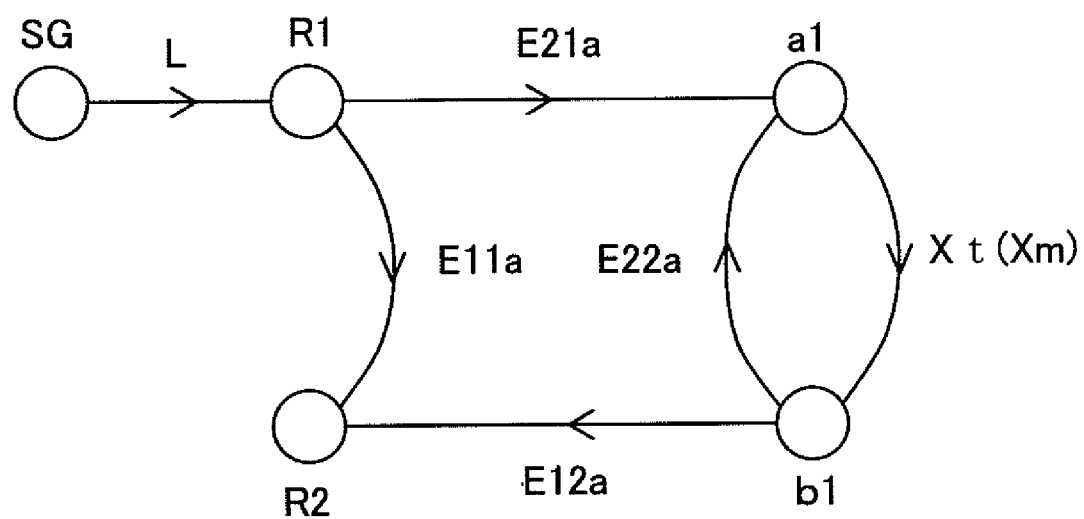
FIG. 5 is a signal flow graph representing the error factor determination device 20 in the state shown in FIG. 4.

FIG. 5 is a signal flow graph representing the error factor determination device 20 in the state shown in FIG. 4. In FIG. 5, the following equation (1) holds:

$$R2/R1 = E11a + (E21a \cdot E12a \cdot X)/(1 - E22a \cdot X) \tag{1}$$

It should be noted that X denotes the load coefficient of the calibration tool 62. The calibration tool 62 is a well-known tool which realizes the states: open, short-circuit, standard load Z0, and arbitrary load (refer to Patent Document 1).

The following equation (2) is obtained by solving the equation (1) in terms of X.

$$X = 1/(E22a + ((E21a \cdot E12a)/(R2/R1 - E11a))) \tag{2}$$

The reflection coefficient deriving unit 24 assigns the measurement results R1 and R2 of the signal to the equation (2). Moreover, the reflection coefficient deriving unit 24 reads the error factors Eija recorded in the error factor recording unit 22, and assigns the read error factors Eija to the equation (2). As a result, the reflection coefficient deriving unit 24 derives the load factor of the calibration tool 62, namely, the reflection coefficient X of the output terminal 19a (S14).

The derived reflection coefficient X is Xm, as described above. Thus, the derived reflection coefficient Xm is supposed to coincide with the real value Xt of the reflection coefficient X. If Xm and Xt do not coincide with each other, it is considered that the error factors Eija are false. In other words, the error factors Eija recorded in the error factor recording unit 22 do not coincide with the error factors Eija of the signal generation system 100 when the signal was measured. It is considered that this phenomenon is caused by a secular change or a failure of the signal generation system 100, for example.

The derived reflection coefficient Xm is fed to the true/false determination unit 28. Moreover, the true value Xt of the reflection coefficient X of the output terminal 19a is fed to the true/false determination unit 28 via the true value input unit 26. The true/false determination unit 28 compares the derived reflection coefficient Xm and the true value Xt with each other (S16).

A description will now be given of an operation of the true/false determination unit 28 with reference to the flowchart in FIG. 23.

The true/false determination unit 28 determines whether the derived reflection coefficient Xm and the true value Xt of the reflection coefficient coincide with each other (S160). If Xm and Xt coincide with each other ("YES" in the step S160), the true/false determination unit 28 determines that the error factors Eija recorded in the error factor recording unit 22 are true (S161).

If Xm and Xt do not coincide with each other ("NO" in the step S160), the true/false determination unit 28 determines that the error factors Eija recorded in the error factor recording unit 22 are false (S162).

On this occasion, even if Xm and Xt do not coincide with each other, but the difference between Xm and Xt is within the predetermined range ("YES" in a step S164), the true/false determination unit 28 determines that the difference is caused by a secular change of the signal generation system 100, and advises the measurement of the error factors Eija (S166). For example, the true/false determination unit 28 causes a display (not shown) of the error factor determination device 20 to show a message advising the measurement of the error factors Eija ("Calibrate signal generation system", for example).

If Xm and Xt do not coincide with each other, and the difference between Xm and Xt is not within the predetermined range ("NO" in the step S164), the true/false determination unit 28 determines that the signal generation system 100 has failed, and reports so (S168). For example, the true/false determination unit 28 causes the display (not shown) of the error factor determination device 20 to show a message ("Signal generation system has failed", for example).

A description will now be given of an operation of determination whether the amplification factor of the amplifier 13 recorded in the amplification factor recording unit 25 is true or false.

The attachment of the calibration tool 62 (S10), and the measurement of R1 and R2 (S12) are carried out as described above. Then, the power SG of the signal and the measured R1 are fed to the amplification factor deriving unit 23. The amplification factor deriving unit 23 derives the amplification factor L as: L=R1/SG. Then, the amplification factor true/false determination unit 29 determines whether the recorded amplification factor is true or false based on the amplification factor recorded in the amplification factor recording unit 25 and the amplification factor derived by the amplification factor deriving unit 23.

According to the first embodiment, it is possible to determine whether the error factors Eija recorded in the error factor recording unit 22 are true or false by measuring R1 and R2 while the calibration tool 62 the reflection coefficient of which is known is connected to the output terminal 19a, or none is connected to the output terminal 19a (non-connection state) (it should be noted that the reflection coefficient of the output terminal 19a is known in the non-connection state).

In other words, since it is possible to determine whether the error factors Eija recorded in the error factor recording unit 22 are true or false without measuring the error factors Eija while the three states: open, short-circuit, load (standard load Z0) are realized on the output terminal 19a, and, further, connecting a power meter, it is easy to determine whether the error factors Eija are true or false.

If it is determined that the error factors Eija are true, the error factors Eija recorded in the error factor recording unit 22 can be used as the error factors of the signal generation system 100. Since it is not necessary to measure the error factors Eija, it is possible to reduce the labor required for the calibration.

Moreover, if it is determined that the error factors Eija are false, it may be necessary to measure the error factors of the signal generation system 100. However, since it is not necessary to measure the error factors each time when circuit parameters of a device under test are measured, it is possible to reduce the labor required for the calibration.

Second Embodiment

A second embodiment is an embodiment relating to a switch-branch signal source (signal generation system) 10 in which a signal source 110 is connected to multiple output terminals 19a, 19b, 19c, and 19d via a switch 18. It should be noted that it is not necessary to know reflection coefficients on respective multiple output terminals 19a, 19b, 19c, and 19d before measurement of the signal in the second embodiment. However, it is necessary for the reflection coefficients on the respective multiple output terminals 19a, 19b, 19c, and 19d to coincide with each other (values of the reflection coefficients are equal).

In the following section, the same components are denoted by the same numerals as of the first embodiment, and will be explained in no more details.

Figure 6:
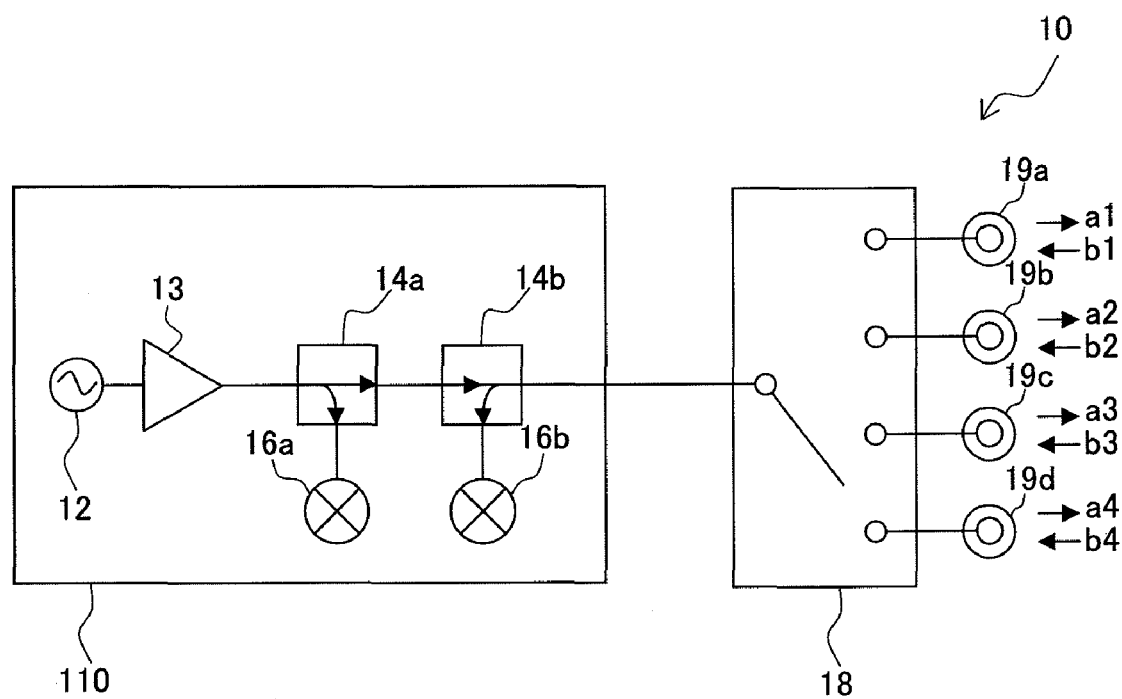
FIG. 6 is a diagram showing a configuration of the switch-branch signal source 10 according to the second embodiment.

FIG. 6 is a diagram showing a configuration of the switch-branch signal source 10 according to the second embodiment. The switch-branch signal source 10 includes the signal source 110, the switch 18, and the output terminals 19a, 19b, 19c, and 19d.

The signal source 110 is to generate a signal. The signal source 110 includes the signal generation unit 12, the amplifier 13, the bridges 14a and 14b, and the mixers 16a and 16b. The signal generation unit 12, the amplifier 13, the bridges 14a and 14b, and the mixers 16a and 16b are the same as those of the first embodiment, and a description thereof, therefore, is omitted.

The switch 18 is connected to the signal source 110, and outputs the signal from any one of the multiple output terminals 19a, 19b, 19c, and 19d.

Any one of the output terminals 19a, 19b, 19c, and 19d is connected to the signal source 110 by the switch 18. Then, the output terminal connected to the signal source 110 outputs the signal.

On this occasion, if the signal is output from the output terminal 19a, an S parameter of the output from the output terminal 19a is a1, and an S parameter of the output reflected back to the output terminal 19a is b1.

If the signal is output from the output terminal 19b, an S parameter of the output from the output terminal 19b is a2, and an S parameter of the output reflected back to the output terminal 19b is b2.

If the signal is output from the output terminal 19c, an S parameter of the output from the output terminal 19c is a3, and an S parameter of the output reflected back to the output terminal 19c is b3.

If the signal is output from the output terminal 19d, an S parameter of the output from the output terminal 19d is a4, and an S parameter of the output reflected back to the output terminal 19d is b4.

Figure 7:
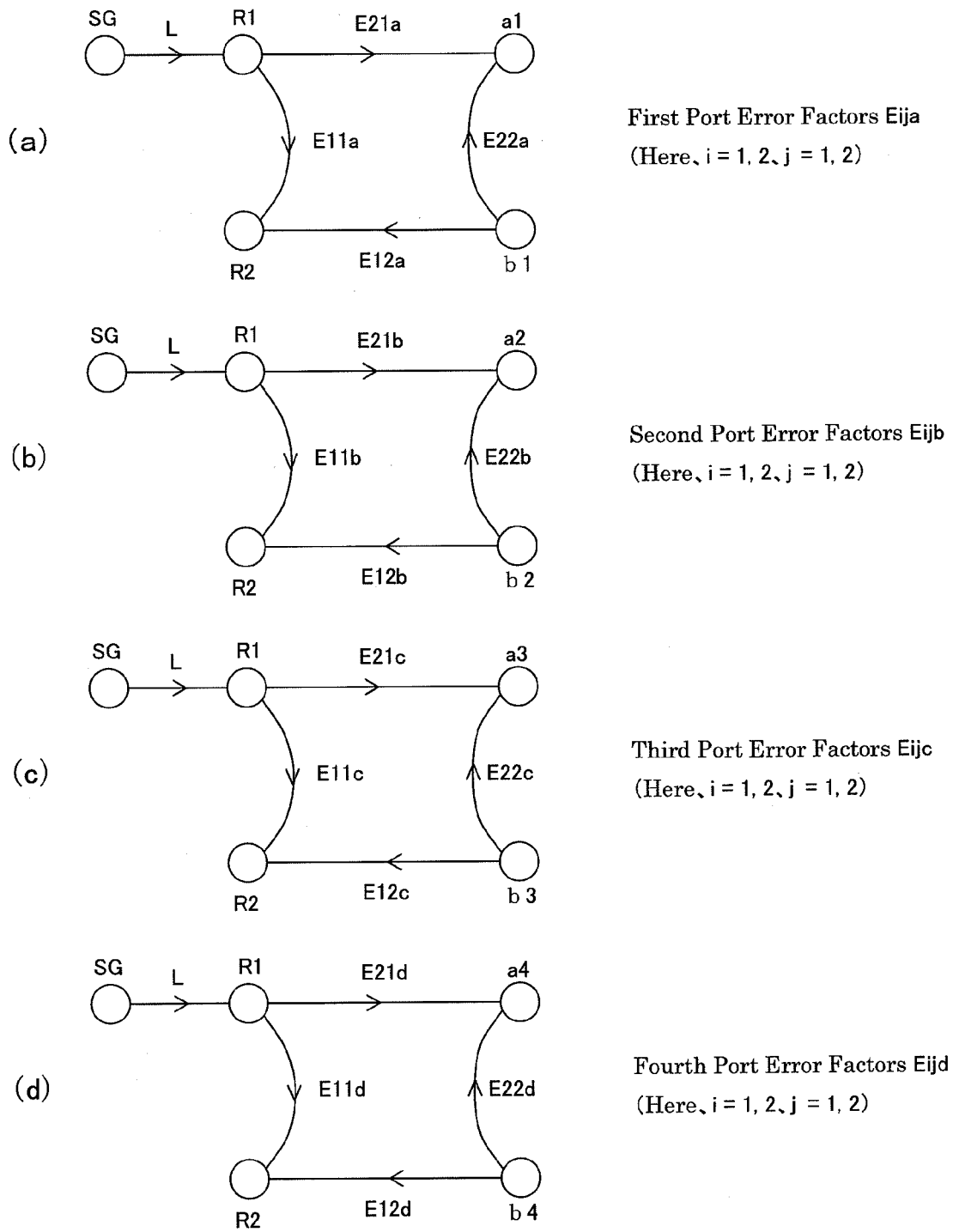
FIG. 7 is signal flow graphs of the switch-branch signal source 10 according to the second embodiment.

FIGS. 7(a) to 7(d) are signal flow graphs of the switch-branch signal source 10 according to the second embodiment. FIG. 7(a) is a signal flow graph when the signal source 110 is connected to the output terminal 19a. FIG. 7(b) is a signal flow graph when the signal source 110 is connected to the output terminal 19b. FIG. 7(c) is a signal flow graph when the signal source 110 is connected to the output terminal 19c. FIG. 7(d) is a signal flow graph when the signal source 110 is connected to the output terminal 19d.

In FIGS. 7(a) to 7(d), SG denotes the output of the signal generation unit 12, R1 denotes the output of the mixer 16a, and R2 denotes the output of the mixer 16b. Moreover, there holds the relationship: $R1 = SG \times L$ as shown in FIG. 7, where L (S parameter) is the amplification factor of the amplifier 13.

With reference to FIG. 7(a), it is observed that, if the signal source 110 is connected to the output terminal 19a, error factors E11a, E12a, E21a, and E22a (S parameters) are generated. The error factors E11a, E12a, E21a, and E22a are referred to as first port error factors.

With reference to FIG. 7(b), it is observed that if the signal source 110 is connected to the output terminal 19b, error factors E11b, E12b, E21b, and E22b (S parameters) are generated. The error factors E11b, E12b, E21b, and E22b are referred to as second port error factors.

With reference to FIG. 7(c), it is observed that if the signal source 110 is connected to the output terminal 19c, error factors E11c, E12c, E21c, and E22c (S parameters) are generated. The error factors E11c, E12c, E21c, and E22c are referred to as third port error factors.

With reference to FIG. 7(d), it is observed that if the signal source 110 is connected to the output terminal 19d, error factors E11d, E12d, E21d, and E22d (S parameters) are generated. The error factors E11d, E12d, E21d, and E22d are referred to as fourth port error factors.

Figure 8:
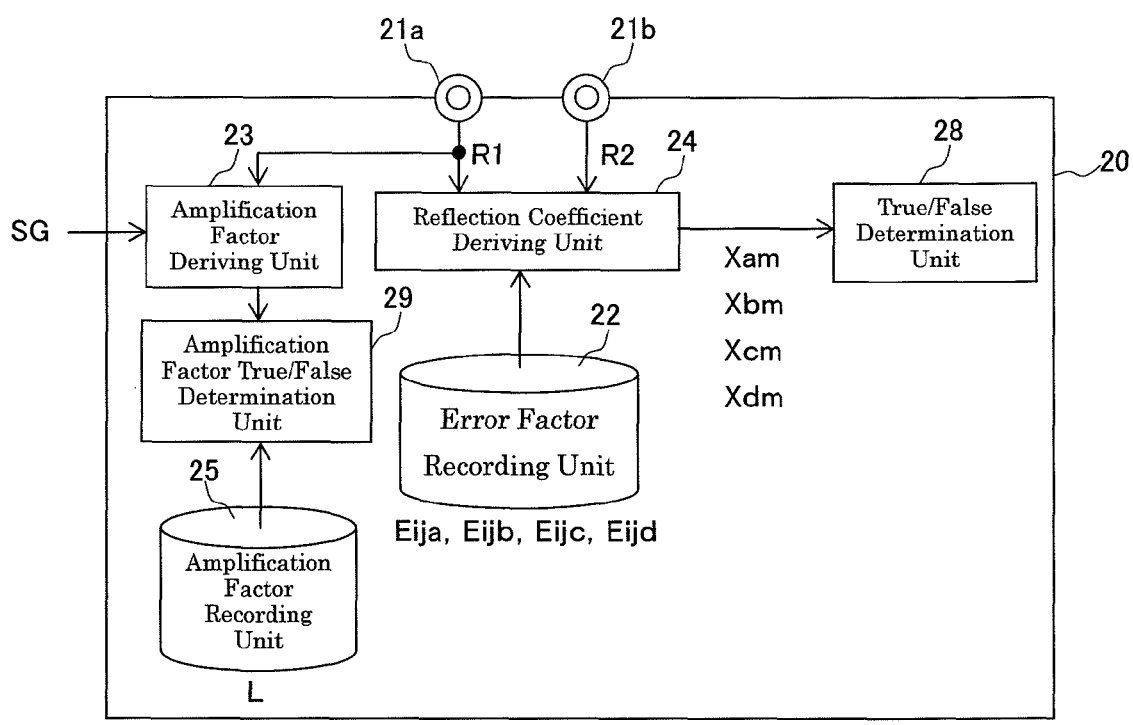
FIG. 8 is a functional block diagram showing a configuration of the error factor determination device 20 according to the second embodiment.

FIG. 8 is a functional block diagram showing a configuration of the error factor determination device 20 according to the second embodiment. The error factor determination device 20 includes the terminals 21a and 21b, the error factor recording unit 22, the amplification factor deriving unit 23, the reflection coefficient deriving unit 24, the amplification factor recording unit 25, the true/false determination unit 28, and the amplification factor true/false determination unit 29.

The terminals 21a and 21b, the amplification factor deriving unit 23, the amplification factor recording unit 25, and the amplification factor true/false determination unit 29 are the same as those of the first embodiment, and a description thereof, therefore, is omitted.

The error factor recording unit 22 records the first port error factors Eija, the second port error factors Eijb, the third port error factors Eijc, and the fourth port error factors Eijd, which are the error factors of the switch-branch signal source (signal generation system) 10.

The reflection coefficient deriving unit 24 derives respective reflection coefficients Xam, Xbm, Xcm, and Xdm of the output terminals 19a, 19b, 19c, and 19d based on the measurement results R1 and R2 of the signal while the signal is being output respectively from the output terminals 19a, 19b, 19c, and 19d, and the error factors Eija, Eijb, Eijc, and Eijd recorded in the error factor recording unit 22. It should be noted that the measurement results R1 and R2 of the signal were acquired when the respective reflection coefficients of the multiple output terminals 19a, 19b, 19c, and 19d coincide with each other.

Figure 9:
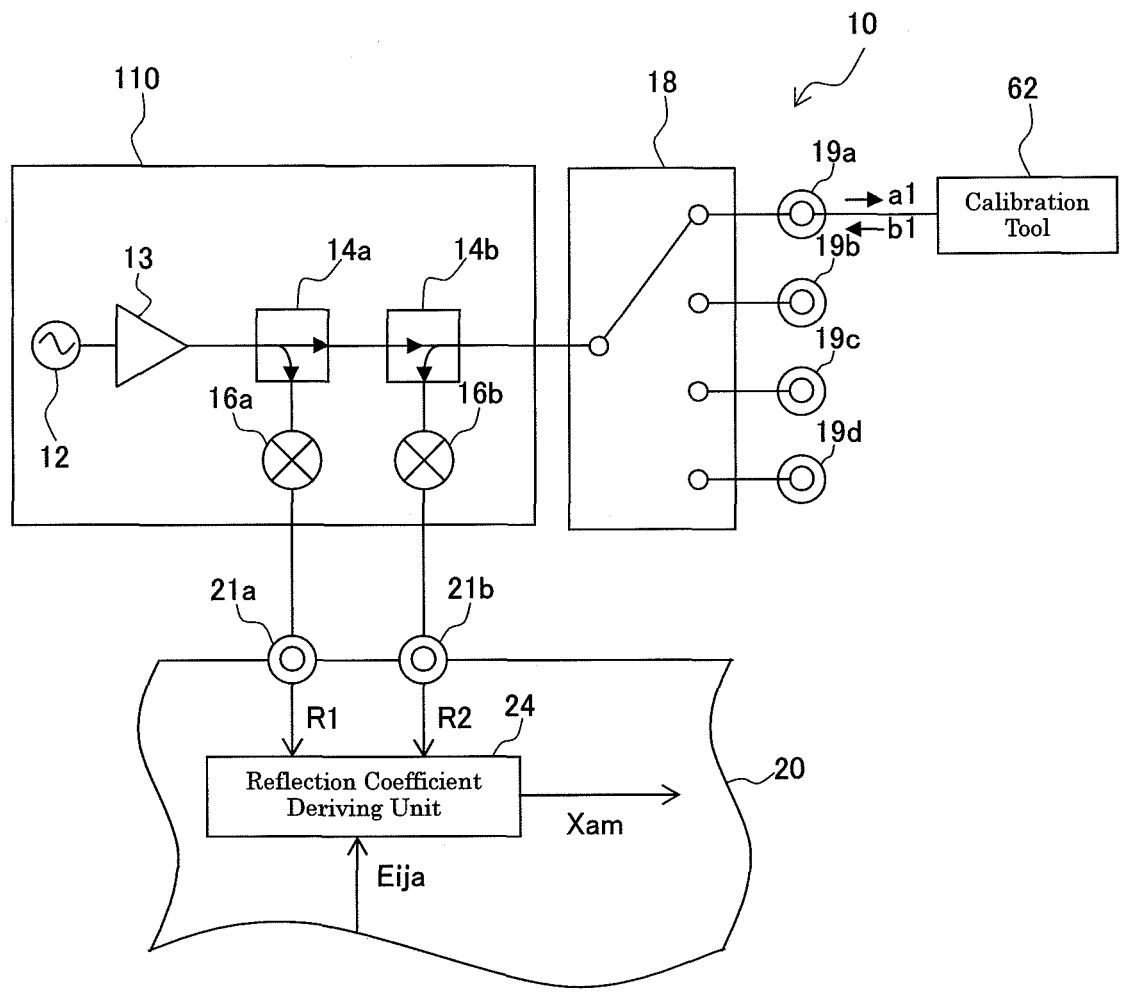
FIG. 9 shows the state in which the calibration tool 62 is connected to the output terminal 19a, and the mixers 16a and 16b are respectively connected to the terminals 21a and 21b.

Specifically, the reflection coefficient deriving unit 24 derives the reflection coefficient Xam of the output terminal 19a based on the measurement results R1 and R2 of the signal while the signal is being output from the output terminal 19a, and the error factors Eija recorded in the error factor recording unit 22 (refer to FIG. 9).

Figure 10:
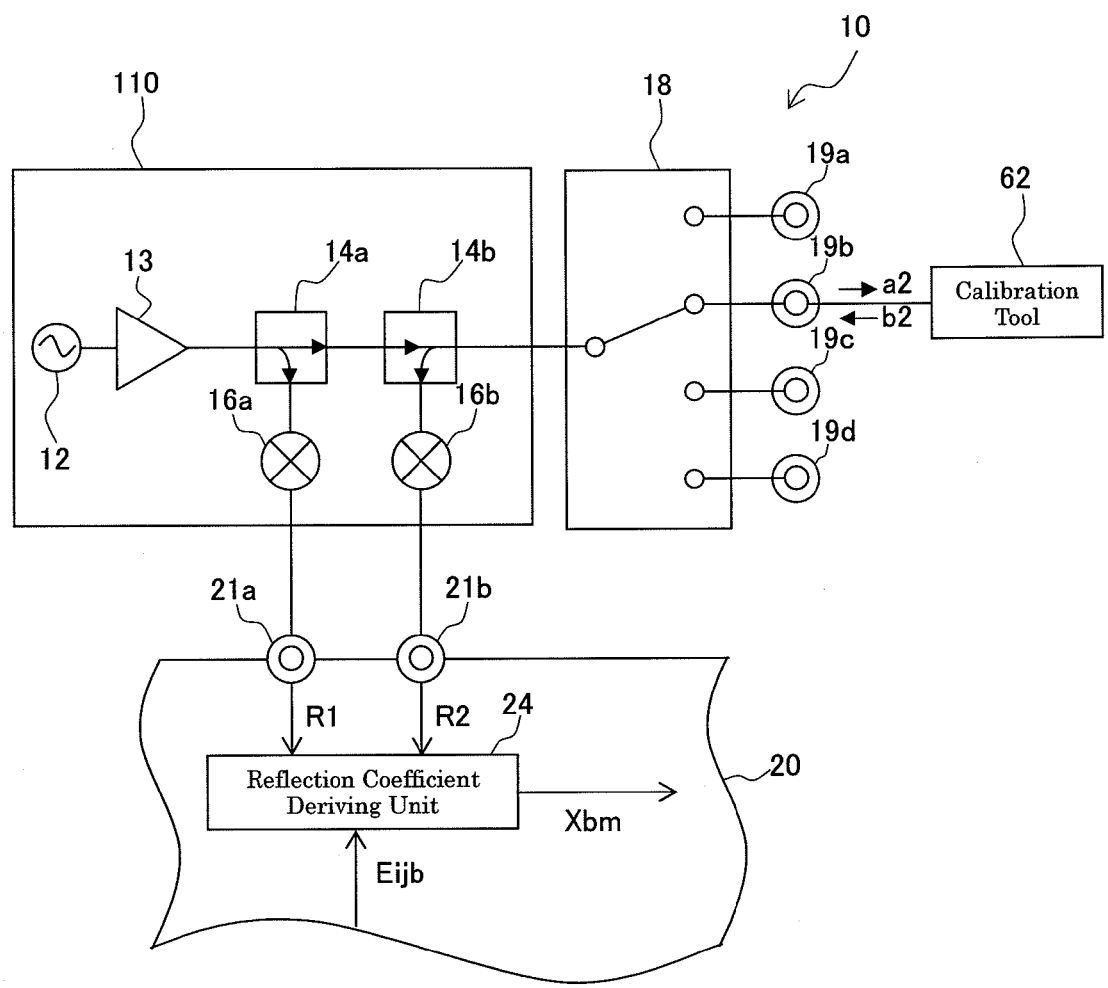
FIG. 10 shows the state in which the calibration tool 62 is connected to the output terminal 19b, and the mixers 16a and 16b are respectively connected to the terminals 21a and 21b.

The reflection coefficient deriving unit 24 derives the reflection coefficient Xbm of the output terminal 19b based on the measurement results R1 and R2 of the signal while the signal is being output from the output terminal 19b, and the error factors Eijb recorded in the error factor recording unit 22 (refer to FIG. 10).

Figure 11:
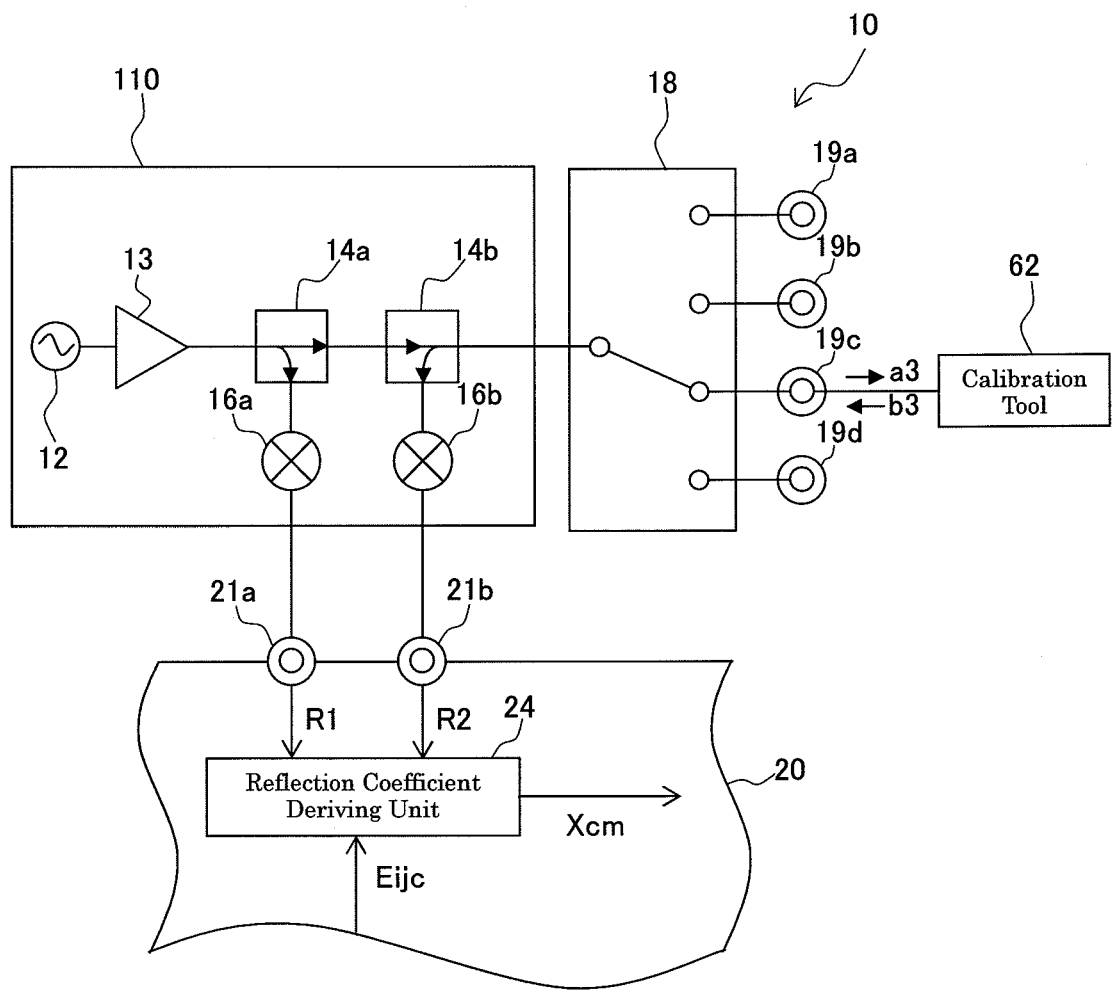
FIG. 11 shows the state in which the calibration tool 62 is connected to the output terminal 19c, and the mixers 16a and 16b are respectively connected to the terminals 21a and 21b.

The reflection coefficient deriving unit 24 derives the reflection coefficient Xcm of the output terminal 19c based on the measurement results R1 and R2 of the signal while the signal is being output from the output terminal 19c, and the error factors Eijc recorded in the error factor recording unit 22 (refer to FIG. 11).

Figure 12:
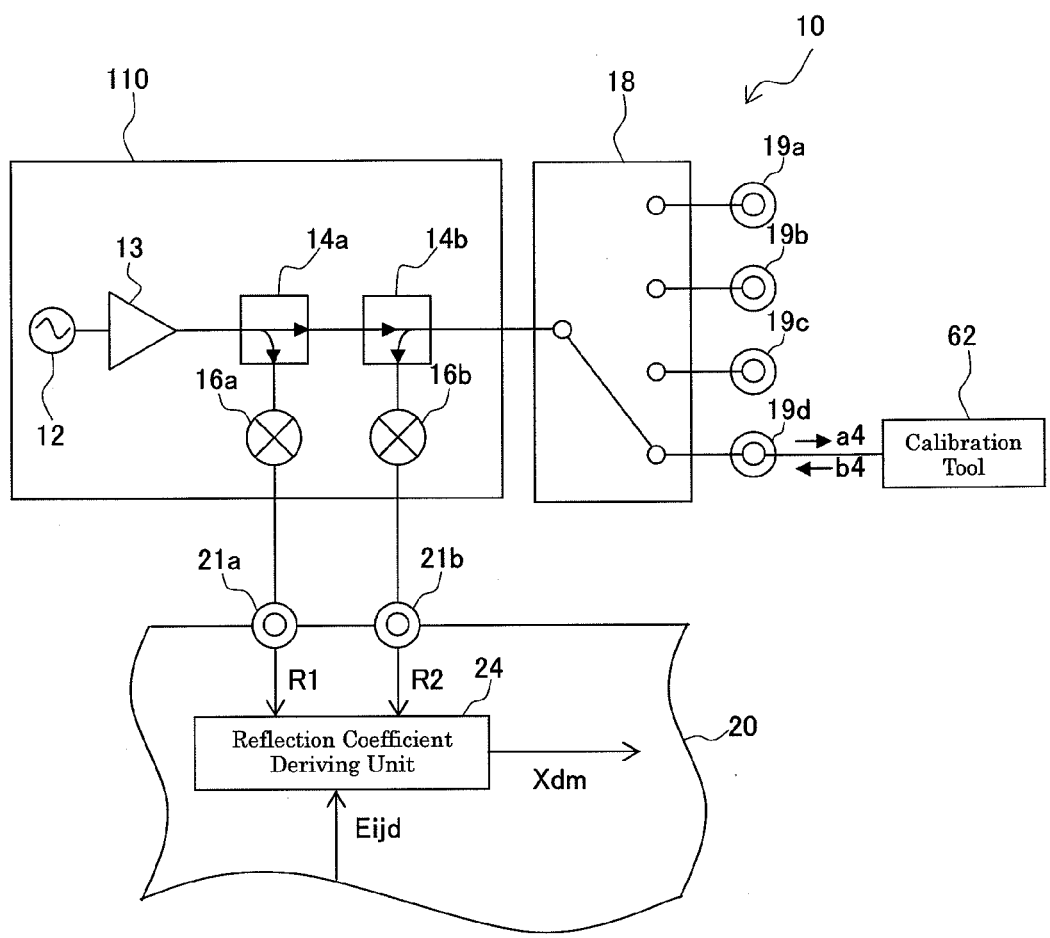
FIG. 12 shows the state in which the calibration tool 62 is connected to the output terminal 19d, and the mixers 16a and 16b are respectively connected to the terminals 21a and 21b.

The reflection coefficient deriving unit 24 derives the reflection coefficient Xdm of the output terminal 19d based on the measurement results R1 and R2 of the signal while the signal is being output from the output terminal 19d, and the error factors Eijd recorded in the error factor recording unit 22 (refer to FIG. 12).

Referring to FIGS. 9, 10, 11, and 12, the same calibration tool 62 is connected to the respective multiple output terminals 19a, 19b, 19c, and 19d. As a result, it is possible to realize a state in which the respective reflection coefficients of the multiple output terminals 19a, 19b, 19c, and 19d coincide with each other. The calibration tools 62 are the same as those of the first embodiment, and hence description thereof is omitted.

Moreover, if the multiple output terminals 19a, 19b, 19c, and 19d are of the same type, it is possible to realize the state in which the respective reflection coefficients of the multiple output terminals 19a, 19b, 19c, and 19d coincide with each other by causing the multiple output terminals 19a, 19b, 19c, and 19d to be in the non-connection state. It should be noted that the state in which the multiple output terminals 19a, 19b, 19c, and 19d have the same type implies these terminals have the same reflection coefficient.

It should be noted that FIGS. 13(a) to 13(d) are signal flow graphs showing the error factor determination device 20 in the states respectively shown in FIGS. 9, 10, 11, and 12.

The true/false determination unit 28 determines whether the error factors Eija, Eijb, Eijc, and Eijd recorded in the error factor recording unit 22 are true or false based on whether the reflection coefficients Xam, Xbm, Xcm, and Xdm derived by the reflection coefficient deriving unit 24 coincide with each other.

Specifically, if Xam, Xbm, Xcm, and Xdm coincide with each other, the true/false determination unit 28 determines that the error factors Eija, Eijb, Eijc, and Eijd are true. The true/false determination unit 28, upon determining the error factors Eija, Eijb, Eijc, and Eijd are false, advises a measurement of the error factors Eija, Eijb, Eijc, and Eijd or reports a failure of the switch-branch signal source (signal generation system) 10.

For example, even if the true/false determination unit 28 determines that the error factors Eija, Eijb, Eijc, and Eijd are false, but a difference among Xam, Xbm, Xcm, and Xdm is within a predetermined range, the true/false determination unit 28 determines that this is caused by a secular change of the switch-branch signal source 10, and advises the measurement of the error factors Eija, Eijb, Eijc, and Eijd.

For example, if the true/false determination unit 28 determines that the error factors Eija, Eijb, Eijc, and Eijd are false, and the difference among Xam, Xbm, Xcm, and Xdm exceeds the predetermined range, the true/false determination unit 28 determines that this is caused by a failure of the switch-branch signal source 10, and reports so.

The case in which Xam, Xbm, Xcm, and Xdm coincide with each other means a case in which Xam=Xbm=Xcm=Xdm. However, even if Xam=Xbm=Xcm=Xdm does not hold, but the difference among Xam, Xbm, Xcm, and Xdm is within a permissible range, it is considered that Xam, Xbm, Xcm, and Xdm coincide with each other. The difference among Xam, Xbm, Xcm, and Xdm implies a difference between the maximum and the minimum of Xam, Xbm, Xcm, and Xdm.

Figure 24:
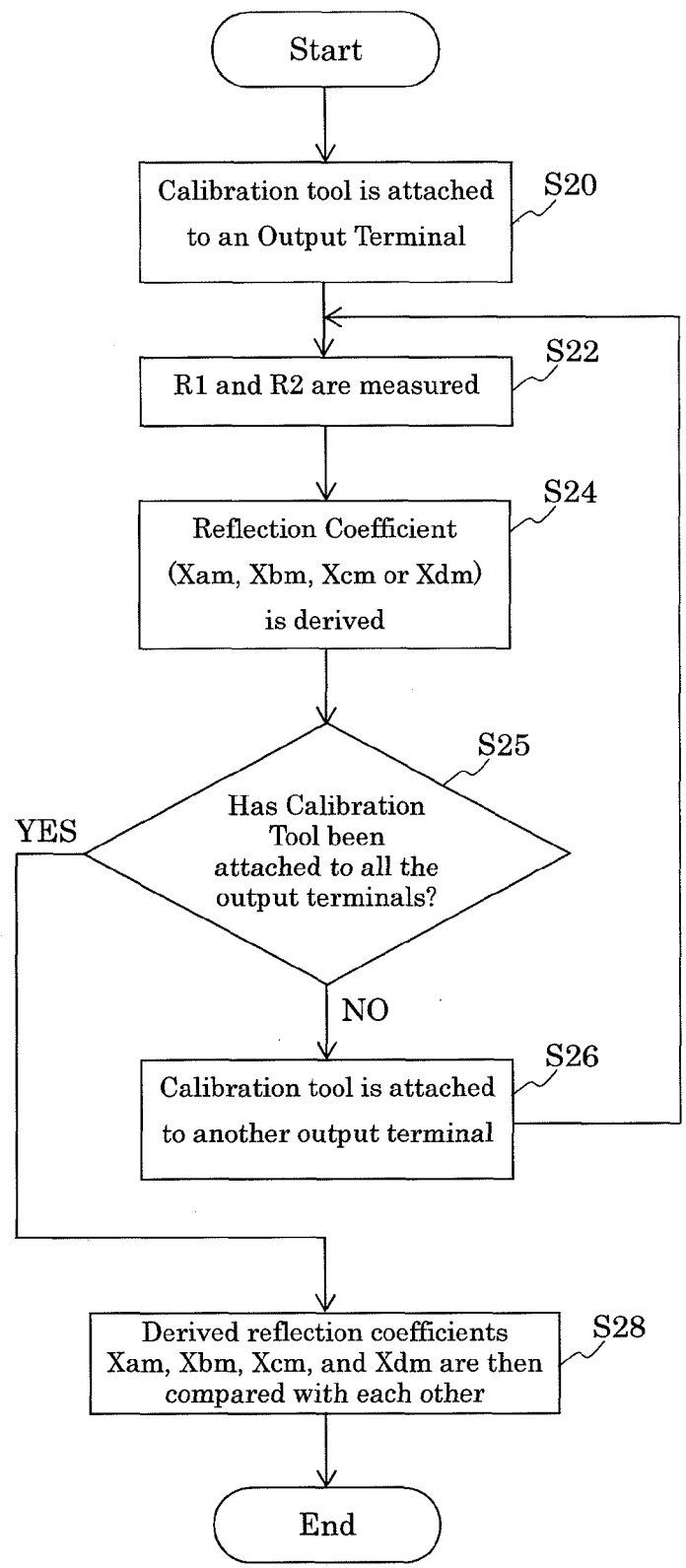
FIG. 24 is a flowchart showing an operation of the error factor determination device 20 according to the second embodiment.
Figure 25:
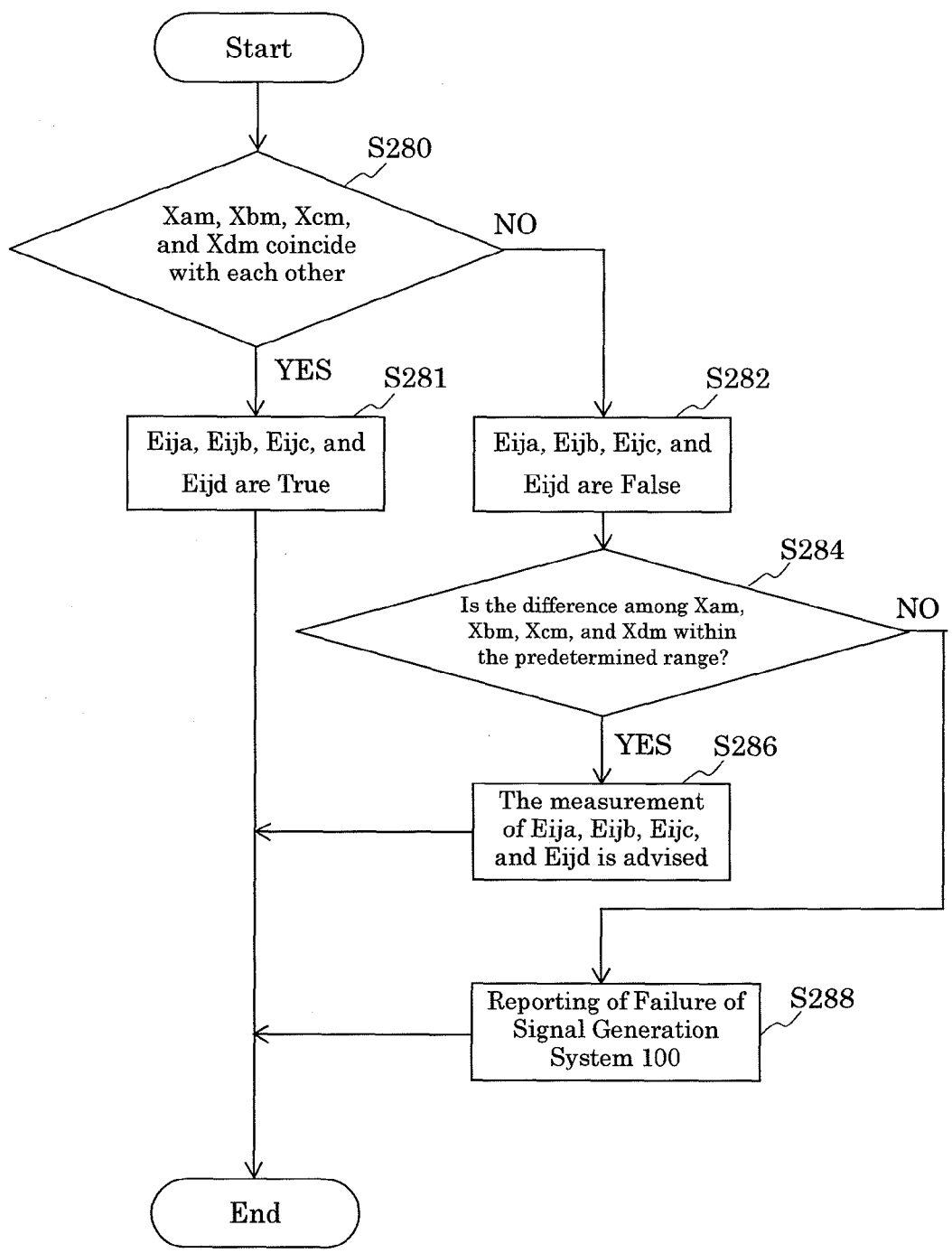
FIG. 25 is a flowchart showing an operation of the true/false determination unit 28 of the error factor determination device 20 according to the second embodiment.

A description will now be given of an operation of the second embodiment with reference to flowcharts in FIGS. 24 and 25. FIG. 24 is a flowchart showing an operation of the error factor determination device 20 according to the second embodiment. FIG. 25 is a flowchart showing an operation of the true/false determination unit 28 of the error factor determination device 20 according to the second embodiment.

First, the calibration tool 62 is attached to the output terminal (19a, for example) of the switch-branch signal source 10 (S20). Moreover, the mixer 16a of the switch-branch signal source 10 is connected to the terminal 21a of the error factor determination device 20, and the mixer 16b of the switch-branch signal source 10 is connected to the terminal 21b of the error factor determination device 20. Further, the switch 18 connects the signal source 110 and the output terminal 19a with each other.

FIG. 9 shows the state in which the calibration tool 62 is connected to the output terminal 19a, and the mixers 16a and 16b are respectively connected to the terminals 21a and 21b. It should be noted that components other than the terminals 21a and 21b of the error factor determination device 20, and the reflection coefficient deriving unit 24 are not shown in FIG. 9. R1 is a measurement result of the signal before the error factors Eija are generated. R2 is a measurement result of the reflected signal. R1 and R2 are the measurement results of the signal.

It should be noted that the reflected signal is a resulting signal (b1) which is the signal (a1) output from the output terminal 19a and then reflected by the calibration tool 62. Moreover, the signal (b1) reflected by the calibration tool 62 is fed to the bridge 14b via the switch 18. The reflected signal fed to the bridge 14b is fed to the mixer 16b, and is multiplied by the local signal. The output of the mixer 16b is R2.

Moreover, the signal before the error factors Eija are generated is fed to the bridge 14a. The signal fed to the bridge 14a is fed to the mixer 16a, and is multiplied by the local signal. The output of the mixer 16a is R1.

In this way, R1 and R2 are measured (S22).

The measured outputs R1 and R2 are fed to the reflection coefficient deriving unit 24.

Figure 13:
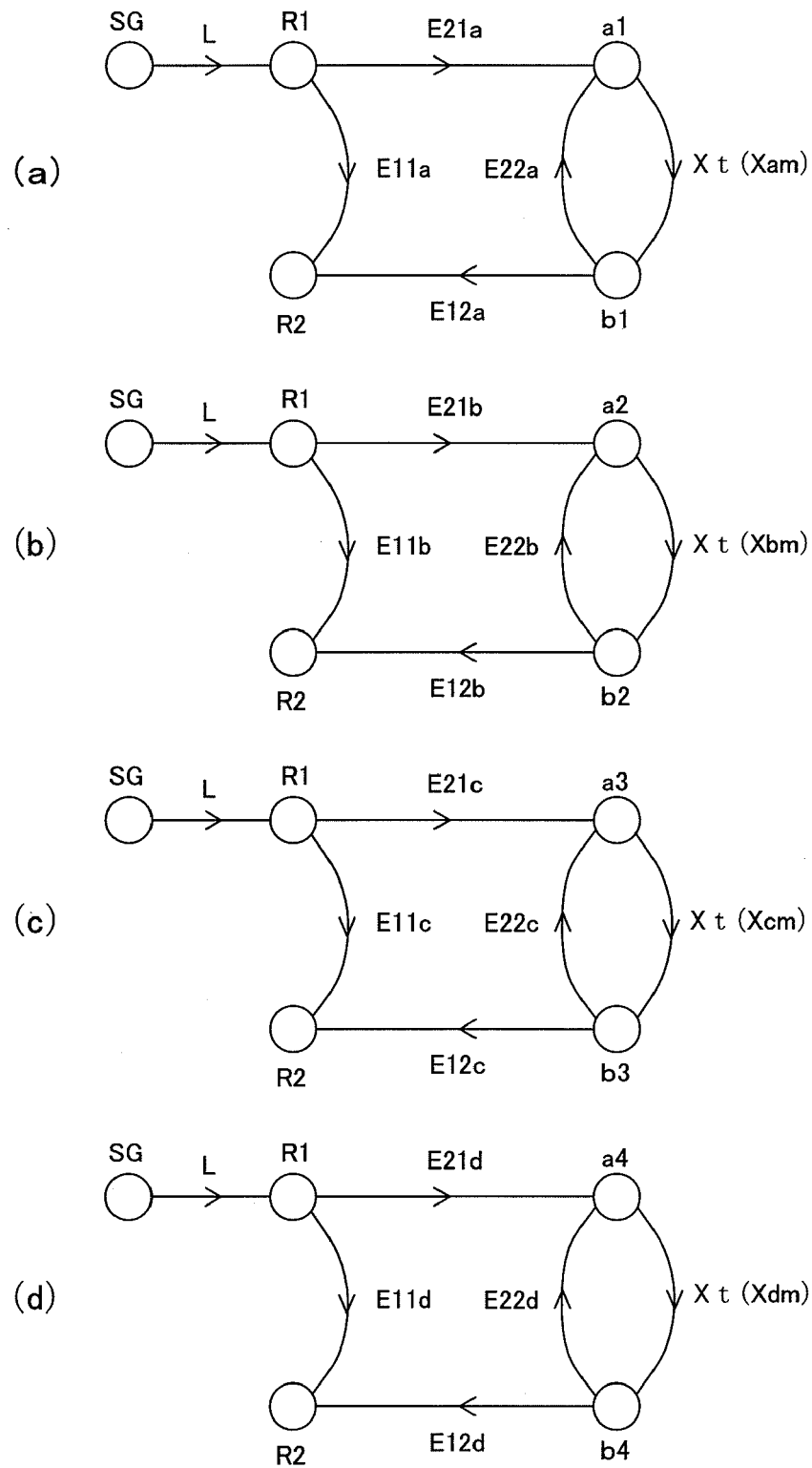
FIG. 13(a) is a signal flow graph representing the error factor determination device 20 in the state shown in FIG. 9.
FIG. 13(b) is a signal flow graph representing the error factor determination device 20 in the state shown in FIG. 10.
FIG. 13(c) is a signal flow graph representing the error factor determination device 20 in the state shown in FIG. 11.
FIG. 13(d) is a signal flow graph representing the error factor determination device 20 in the state shown in FIG. 12.

FIG. 13(*a*) is a signal flow graph representing the error factor determination device 20 in the state shown in FIG. 9. In FIG. 13(*a*), the above equation (1) holds. It should be noted that X denotes the load coefficient of the calibration tool 62. The above equation (2) is obtained by solving the equation (1) in terms of X.

The reflection coefficient deriving unit 24 assigns the measurement results R1 and R2 of the signal to the equation (2). Moreover, the reflection coefficient deriving unit 24 reads the error factors Eija recorded in the error factor recording unit 22, and assigns the read error factors Eija to the equation (2). As a result, the reflection coefficient deriving unit 24 derives the load factor of the calibration tool 62, namely, the reflection coefficient X of the output terminal 19a (S24).

The derived reflection coefficient X is Xam, as described above.

Then, until the calibration tool 62 has been attached to all the output terminals 19a, 19b, 19c, and 19d ("YES" in a step S25), the calibration tool 62 is attached to another output terminal (S26).

For example, the calibration tool 62 is attached to the output terminal 19b of the switch-branch signal source 10 (S26). Further, the switch 18 connects the signal source 110 and the output terminal 19b with each other.

FIG. 10 shows the state in which the calibration tool 62 is connected to the output terminal 19b, and the mixers 16a and 16b are respectively connected to the terminals 21a and 21b. It should be noted that components other than the terminals 21a and 21b of the error factor determination device 20, and the reflection coefficient deriving unit 24 are not shown in FIG. 10. R1 is the measurement result of the signal before the error factors Eijb are generated. R2 is the measurement result of the reflected signal. R1 and R2 are the measurement results of the signal.

It should be noted that the reflected signal is the resulting signal (b2) which is the signal (a2) output from the output terminal 19b and then reflected by the calibration tool 62. Moreover, the signal (b2) reflected by the calibration tool 62 is fed to the bridge 14b via the switch 18. The reflected signal fed to the bridge 14b is fed to the mixer 16b, and is multiplied by the local signal. The output of the mixer 16b is R2.

Moreover, the signal before the error factors Eijb are generated is fed to the bridge 14a. The signal fed to the bridge 14a is fed to the mixer 16a, and is multiplied by the local signal. The output of the mixer 16a is R1.

In this way, R1 and R2 are measured (S22).

The measured outputs R1 and R2 are fed to the reflection coefficient deriving unit 24.

FIG. 13(*b*) is a signal flow graph representing the error factor determination device 20 in the state shown in FIG. 10. In FIG. 13(*b*), the above equation (1) holds. It should be noted that X denotes the load coefficient of the calibration tool 62. The above equation (2) is obtained by solving the equation (1) in terms of X.

The reflection coefficient deriving unit 24 assigns the measurement results R1 and R2 of the signal to the equation (2). Moreover, the reflection coefficient deriving unit 24 reads the error factors Eijb recorded in the error factor recording unit 22, and assigns the read error factors Eijb to the equation (2). As a result, the reflection coefficient deriving unit 24 derives the load factor of the calibration tool 62, namely, the reflection coefficient X of the output terminal 19a (S24).

The derived reflection coefficient X is Xbm, as described above.

Further, the calibration tool 62 is attached to the output terminal 19c of the switch-branch signal source 10 (S26). Further, the switch 18 connects the signal source 110 and the output terminal 19c with each other.

FIG. 11 shows the state in which the calibration tool 62 is connected to the output terminal 19c, and the mixers 16a and 16b are respectively connected to the terminals 21a and 21b. It should be noted that components other than the terminals 21a and 21b of the error factor determination device 20, and the reflection coefficient deriving unit 24 are not shown in FIG. 11. R1 is a measurement result of the signal before the error factors Eijc are generated. R2 is the measurement result of the reflected signal. R1 and R2 are the measurement results of the signal.

It should be noted that the reflected signal is a resulting signal (b3) which is the signal (a3) output from the output terminal 19c and then reflected by the calibration tool 62. Moreover, the signal (b3) reflected by the calibration tool 62 is fed to the bridge 14b via the switch 18. The reflected signal fed to the bridge 14b is fed to the mixer 16b, and is multiplied by the local signal. The output of the mixer 16b is R2.

Moreover, the signal before the error factors Eijc are generated is fed to the bridge 14a. The signal fed to the bridge 14a is fed to the mixer 16a, and is multiplied by the local signal. The output of the mixer 16a is R1.

In this way, R1 and R2 are measured (S22).

The measured outputs R1 and R2 are fed to the reflection coefficient deriving unit 24.

FIG. 13(c) is a signal flow graph representing the error factor determination device 20 in the state shown in FIG. 11. In FIG. 13(c), the above equation (1) holds. It should be noted that X denotes the load coefficient of the calibration tool 62. The above equation (2) is obtained by solving the equation (1) in terms of X.

The reflection coefficient deriving unit 24 assigns the measurement results R1 and R2 of the signal to the equation (2). Moreover, the reflection coefficient deriving unit 24 reads the error factors Eijc recorded in the error factor recording unit 22, and assigns the read error factors Eijc to the equation (2). As a result, the reflection coefficient deriving unit 24 derives the load factor of the calibration tool 62, namely, the reflection coefficient X of the output terminal 19a (S24).

The derived reflection coefficient X is Xcm, as described above.

Further, the calibration tool 62 is attached to the output terminal 19d of the switch-branch signal source 10 (S26). Further, the switch 18 connects the signal source 110 and the output terminal 19d with each other.

FIG. 12 shows the state in which the calibration tool 62 is connected to the output terminal 19d, and the mixers 16a and 16b are respectively connected to the terminals 21a and 21b. It should be noted that components other than the terminals 21a and 21b of the error factor determination device 20, and the reflection coefficient deriving unit 24 are not shown in FIG. 12. R1 is a measurement result of the signal before the error factors Eijd are generated. R2 is the measurement result of the reflected signal. R1 and R2 are the measurement results of the signal.

It should be noted that the reflected signal is a resulting signal (b4) which is the signal (a4) output from the output terminal 19d and then reflected by the calibration tool 62. Moreover, the signal (b4) reflected by the calibration tool 62 is fed to the bridge 14b via the switch 18. The reflected signal fed to the bridge 14b is fed to the mixer 16b, and is multiplied by the local signal. The output of the mixer 16b is R2.

Moreover, the signal before the error factors Eijd are generated is fed to the bridge 14a. The signal fed to the bridge 14a is fed to the mixer 16a, and is multiplied by the local signal. The output of the mixer 16a is R1.

In this way, R1 and R2 are measured (S22).

The measured outputs R1 and R2 are fed to the reflection coefficient deriving unit 24.

FIG. 13(d) is a signal flow graph representing the error factor determination device 20 in the state shown in FIG. 12. In FIG. 13(d), the above equation (1) holds. It should be noted that X denotes the load coefficient of the calibration tool 62. The above equation (2) is obtained by solving the equation (1) in terms of X.

The reflection coefficient deriving unit 24 assigns the measurement results R1 and R2 of the signal to the equation (2). Moreover, the reflection coefficient deriving unit 24 reads the error factors Eijd recorded in the error factor recording unit 22, and assigns the read error factors Eijd to the equation (2). As a result, the reflection coefficient deriving unit 24 derives the load factor of the calibration tool 62, namely, the reflection coefficient X of the output terminal 19a (S24).

The derived reflection coefficient X is Xdm, as described above.

In this way, if the calibration tool 62 has been once attached to the respective output terminals 19a, 19b, 19c and 19d ("YES" in the step S25), the derived reflection coefficients Xam, Xbm, Xcm, and Xdm are then compared with each other by the true/false determination unit 28 (S28).

It should be noted that the derived reflection coefficients Xam, Xbm, Xcm, and Xdm are fed to the true/false determination unit 28.

The measurement results R1 and R2 of the signal were acquired when the respective reflection coefficients of the multiple output terminals 19a, 19b, 19c, and 19d coincide with each other. Thus, the derived reflection coefficients Xam, Xbm, Xcm, and Xdm are supposed to coincide with the true value Xt of the reflection coefficients of the multiple output terminals 19a, 19b, 19c, and 19d. Thus, Xam, Xbm, Xcm, and Xdm are supposed to coincide with each other (Xam=Xbm=Xcm=Xdm).

If Xam, Xbm, Xcm, and Xdm do not coincide with each other, it can be considered that the error factors Eija, Eijb, Eijc, and Eijd recorded in the error factor recording unit 22 are false. In other words, the error factors Eija, Eijb, Eijc, and Eijd recorded in the error factor recording unit 22 do not coincide with the error factors Eija, Eijb, Eijc, and Eijd of the switch-branch signal source (signal generation system) 10 when the signal is measured. It is considered that this phenomenon is caused by a secular change or a failure of the switch-branch signal source 10, for example.

Thus, it can be determined whether the error factors Eija, Eijb, Eijc, and Eijd recorded in the error factor recording unit 22 are true or false based on whether Xam, Xbm, Xcm, and Xdm coincide with each other.

If the true value Xt of the reflection coefficient was known before the measurement of the signal, it can also be determined whether the error factors Eija, Eijb, Eijc, and Eijd recorded in the error factor recording unit 22 are true or false based on whether Xam coincides with Xt, whether Xbm coincides with Xt, whether Xcm coincides with Xt, and whether Xdm coincides with Xt. The above description is given of the application of the idea of the first embodiment to the switch-branch signal source 10.

The second embodiment is different from the first embodiment in that it is not necessary to know the true value Xt of the reflection coefficient.

A description will now be given of an operation of the true/false determination unit 28 with reference to the flowchart in FIG. 25.

The true/false determination unit 28 determines whether the derived reflection coefficients Xam, Xbm, Xcm, and Xdm coincide with each other (S280). If Xam, Xbm, Xcm, and Xdm coincide with each other ("YES" in the step S280), the true/false determination unit 28 determines that the error factors Eija, Eijb, Eijc, and Eijd recorded in the error factor recording unit 22 are true (S281).

If Xam, Xbm, Xcm, and Xdm do not coincide with each other ("NO" in the step S280), the true/false determination unit 28 determines that the error factors Eija, Eijb, Eijc, and Eijd recorded in the error factor recording unit 22 are false (S282).

On this occasion, even if Xam, Xbm, Xcm, and Xdm do not coincide with each other, but the difference among Xam, Xbm, Xcm, and Xdm is within the predetermined range ("YES" in a step S284), the true/false determination unit 28 determines that the difference is caused by a secular change of the switch-branch signal source 10, and advises the measurement of the error factors Eija, Eijb, Eijc, and Eijd (S286). For example, the display (not shown) of the error factor determination device 20 is caused to show a message advising the measurement of the error factors Eija, Eijb, Eijc, and Eijd ("Calibrate signal source", for example).

On this occasion, if Xam, Xbm, Xcm, and Xdm do not coincide with each other, and the difference among Xam, Xbm, Xcm, and Xdm is not within the predetermined range ("NO" in the step S284), the true/false determination unit 28 determines that the difference is caused by a failure of the switch-branch signal source 10, and reports so (S288). For example, the true/false determination unit 28 causes the display (not shown) of the error factor determination device 20 to show a message ("Signal generation system has failed", for example).

A description will now be given of an operation of determination whether the amplification factor of the amplifier 13 recorded in the amplification factor recording unit 25 is true or false.

The attachment of the calibration tool 62 (S20 and S26), and the measurement of R1 and R2 (S22) are carried out as described above. Then, the power SG of the signal and the measured R1 are fed to the amplification factor deriving unit 23. The amplification factor deriving unit 23 derives the amplification factor L as: L=R1/SG. Then, the amplification factor true/false determination unit 29 determines whether the recorded amplification factor is true or false based on the amplification factor recorded in the amplification factor recording unit 25 and the amplification factor derived by the amplification factor deriving unit 23.

According to the second embodiment, it is possible to determine whether the error factors Eija, Eijb, Eijc, and Eijd recorded in the error factor recording unit 22 are true or false by measuring R1 and R2 in the state in which the same calibration tool 62 is connected to the output terminals 19a, 19b, 19c, and 19d, or none is connected to the output terminals 19a, 19b, 19c, and 19d (non-connection state) (it is assumed that the output terminals 19a, 19b, 19c, and 19d have the same reflection coefficient). Moreover, the determination can be made even if the true value Xt of the reflection coefficient of the output terminals 19a, 19b, 19c, and 19d is not known.

In other words, since it is possible to determine whether the error factors Eija, Eijb, Eijc, and Eijd recorded in the error factor recording unit 22 are true or false without measuring the error factors Eija, Eijb, Eijc, and Eijd while the three states: open, short-circuit, load (standard load Z0) are realized on the output terminals 19a, 19b, 19c, and 19d, and, further, connecting a power meter, it is easy to determine whether the error factors Eija, Eijb, Eijc, and Eijd are true or false.

If it is determined that the error factors Eija, Eijb, Eijc, and Eijd are true, the error factors Eija, Eijb, Eijc, and Eijd recorded in the error factor recording unit 22 can be used as the error factors of the switch-branch signal source (signal generation system) 10. Since it is not necessary to measure the error factors Eija, Eijb, Eijc, and Eijd, it is possible to reduce the labor required for the calibration.

Moreover, if it is determined that the error factors Eija, Eijb, Eijc, and Eijd are false, it may be necessary to measure the error factors of the switch-branch signal source (signal generation system) 10. However, since it is not necessary to measure the error factors each time when circuit parameters of a device under test are measured, it is possible to reduce the labor required for the calibration.

Third Embodiment

A third embodiment is an embodiment provided with multiplicity of the signal generation units 12 (signal generation units 12a and 12b) of the signal generation system 100 according to the first embodiment. It should be noted that, according to the third embodiment, it is not necessary to know the reflection coefficient of the output terminal 19a before the measurement of the signal.

Figure 14:
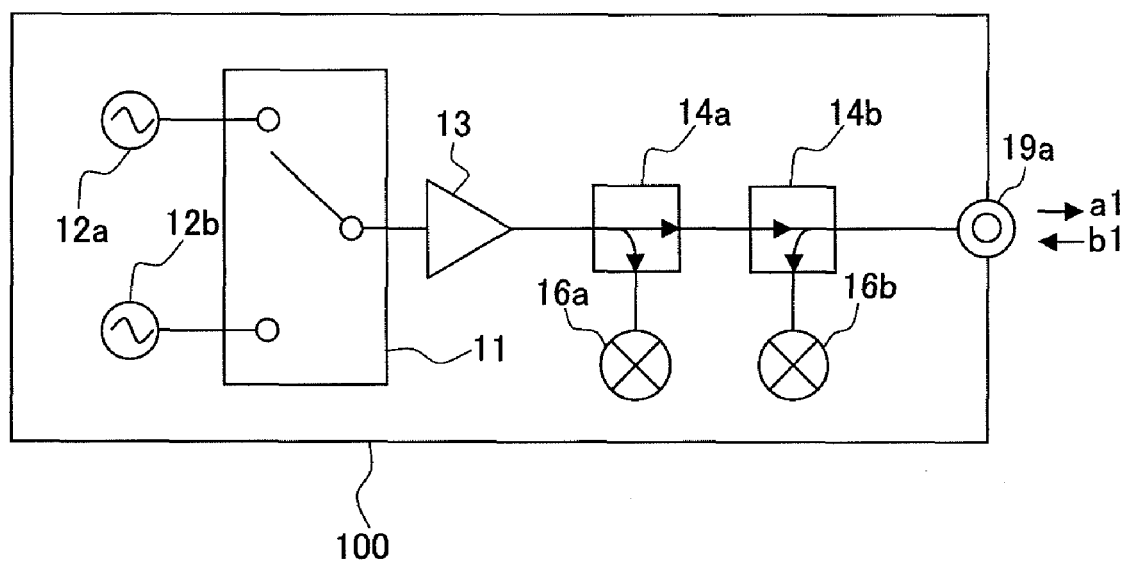
FIG. 14 shows a configuration of the signal generation system 100 according to the third embodiment.

FIG. 14 shows a configuration of the signal generation system 100 according to the third embodiment. The signal generation system 100 includes a switch 11, the signal generation units 12a and 12b, the amplifier 13, the bridges 14a and 14b, the mixers 16a and 16b, and the output terminal 19a.

In the following section, the same components are denoted by the same numerals as of the first embodiment, and will be explained in no more details.

The multiple signal generation units 12a and 12b are the same as the signal generation unit 12. The outputs of the signal generation units 12a and 12b are respectively denoted by SG1 and SG2.

The switch 11 connects either the signal generation unit 12a or 12b to the amplifier 13. Thus, the signal generated by the signal generation unit 12a or the signal generated by the signal generation unit 12b is fed to the amplifier 13.

The amplifier 13, the bridges 14a and 14b, the mixers 16a and 16b, and the output terminal 19a are the same as those of the first embodiment, and a description thereof, therefore, is omitted. It should be noted that the output terminal 19a is a single output terminal as in the first embodiment.

Figure 15:
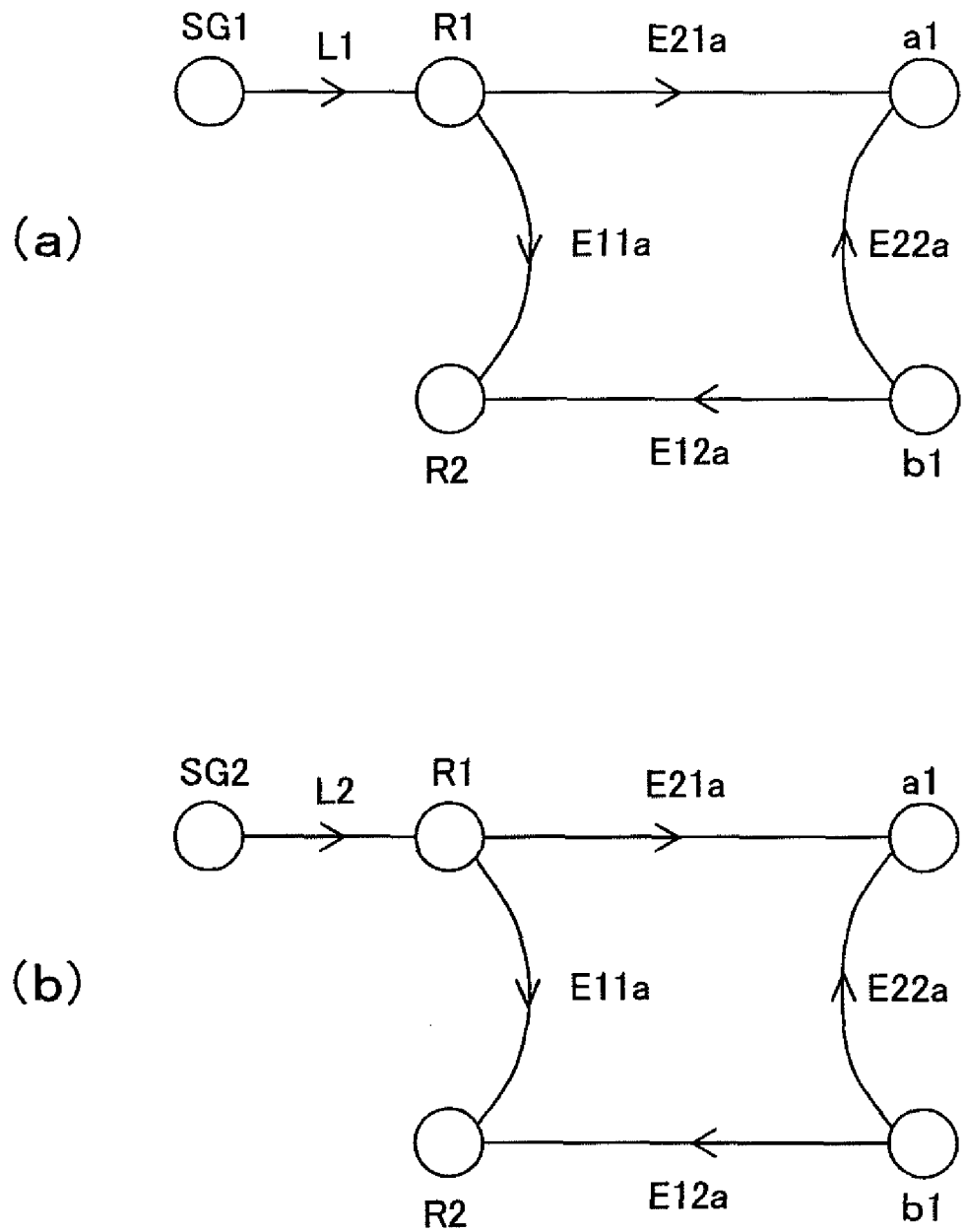
FIG. 15 is a signal flow graph of the signal generation system 100 according to the third embodiment.

FIG. 15 is a signal flow graph of the signal generation system 100 according to the third embodiment.

In FIG. 15, the outputs of the mixers 16a and 16b are respectively denoted by R1 and R2. Moreover, there holds a relationship: $R1=SG1 \times L1$ as shown in FIG. 15(a). Further, there holds a relationship: $R1=SG2 \times L2$ as shown in FIG. 15(b). It should be noted that L1 and L2 (S parameters) are amplification factors of the amplifier 13. Due to a difference in frequency between the signals respectively generated by the signal generation units 12a and 12b, the amplification factor of the amplifier 13 takes different values (L1 and L2).

Referring to FIG. 15, it is observed that error factors E11a, E12a, E21a, and E22a (S parameters) are generated in the signal generation system 100.

Figure 16:
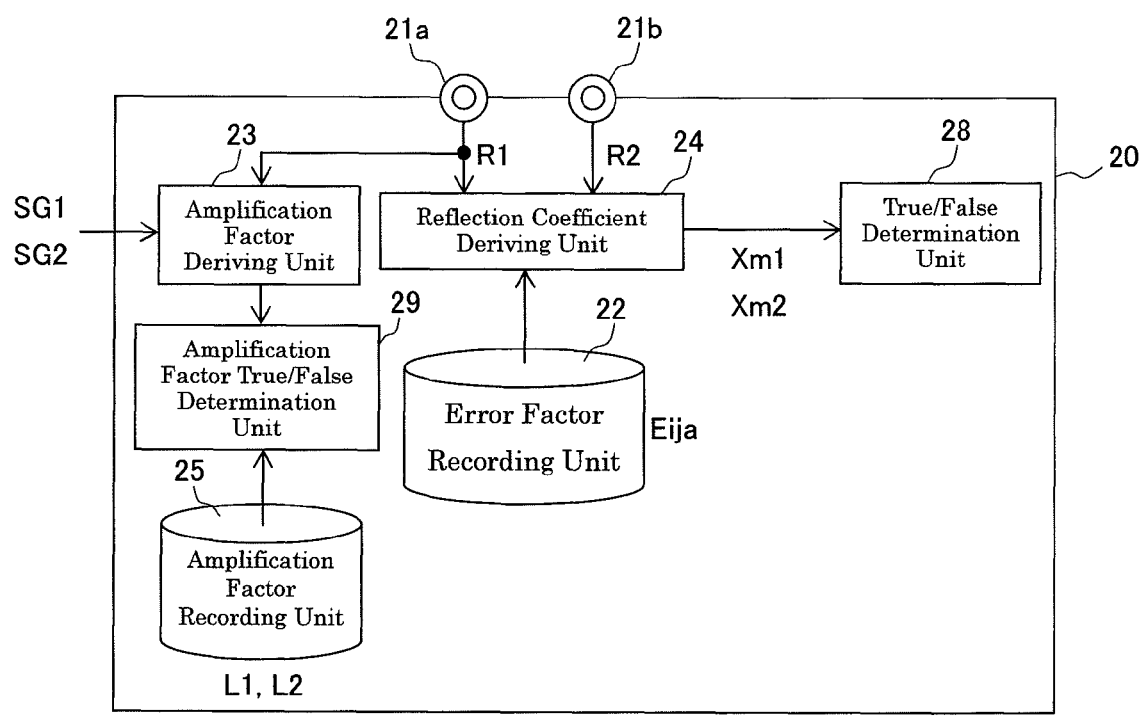
FIG. 16 is a functional block diagram showing a configuration of the error factor determination device 20 according to the third embodiment.

FIG. 16 is a functional block diagram showing a configuration of the error factor determination device 20 according to the third embodiment. The error factor determination device 20 includes terminals 21a and 21b, the error factor recording unit 22, the amplification factor deriving unit 23, the reflection coefficient deriving unit 24, the amplification factor recording unit 25, the true/false determination unit 28, and the amplification factor true/false determination unit 29.

The terminals 21a and 21b and the error factor recording unit 22 are the same as those in the first embodiment, and a description thereof, therefore, is omitted.

The amplification factor deriving unit 23 derives the amplification factors L1 and L2 as L1=R1/SG1, and L2=R1/SG2 based on R1 which is the measurement result of the signal, and the powers SG1 and SG2 of the signals while the signal is being output from the output terminal 19a. It should be noted that the values of the powers SG1 and SG2 of the signal are fed to the amplification factor deriving unit 23 from the outside of the error factor determination device 20. Moreover, the measurement result R1 of the signal is fed to the amplification factor deriving unit 23 via the terminal 21a.

The amplification factor recording unit 25 records the amplification factors L1 and L2 of the amplifier 13.

The amplification factor true/false determination unit 29 is the same as that of the first embodiment, and hence a description thereof is omitted.

The reflection coefficient deriving unit 24 receives the measurement results R1 and R2 of the signal via the terminals 21a and 21b in the state in which the signal is output from the output terminal 19a of the signal generation system 100. Moreover, the reflection coefficient deriving unit 24 reads the error factors Eija from the error factor recording unit 22. Further, the reflection coefficient deriving unit 24 derives reflection coefficients Xm1 and Xm2 of the output terminal 19a based on the measurement results R1 and R2 of the signal, and the error factors Eija. It should be noted that Xm1 is derived when the signal generation unit 12a is connected to the amplifier 13 (refer to FIGS. 17 and 19). Moreover, Xm2 is derived when the signal generation unit 12b is connected to the amplifier 13 (refer to FIGS. 18 and 19). In other words, the reflection coefficient deriving unit 24 derives the reflection coefficients Xm1 and Xm2 of the output terminal 19a respectively for the signal generation units 12a and 12b.

Figure 17:
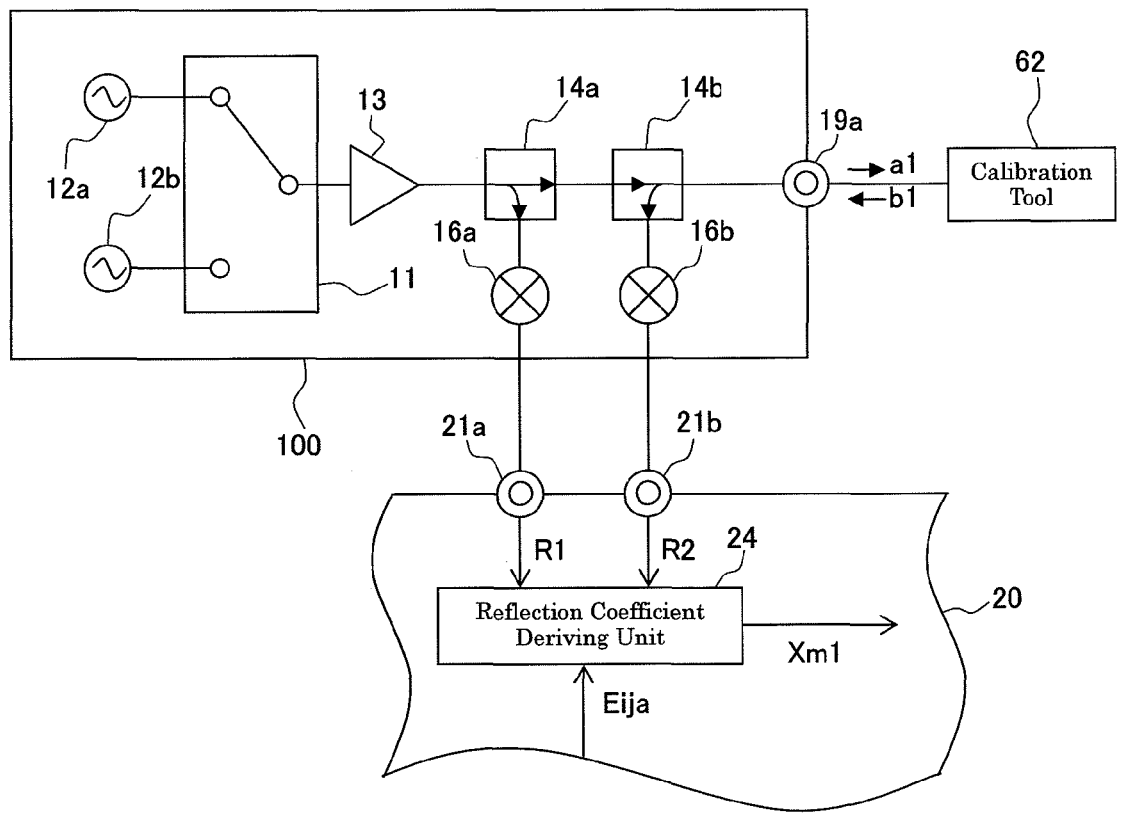
FIG. 17 shows the state in which the calibration tool 62 is connected to the output terminal 19a, the mixers 16a and 16b are respectively connected to the terminals 21a and 21b, and the signal generation unit 12a is connected to the amplifier 13.
Figure 18:
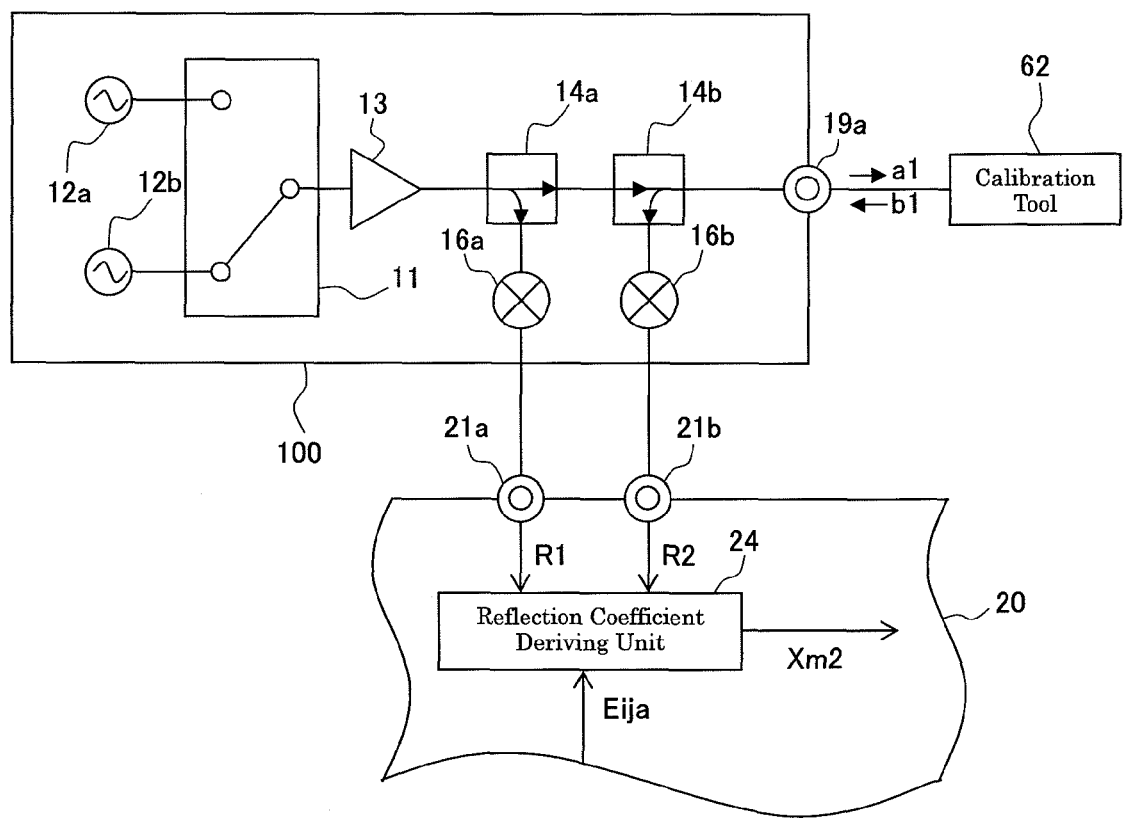
FIG. 18 shows the state in which the calibration tool 62 is connected to the output terminal 19a, the mixers 16a and 16b are respectively connected to the terminals 21a and 21b, and the signal generation unit 12b is connected to the amplifier 13.
Figure 19:
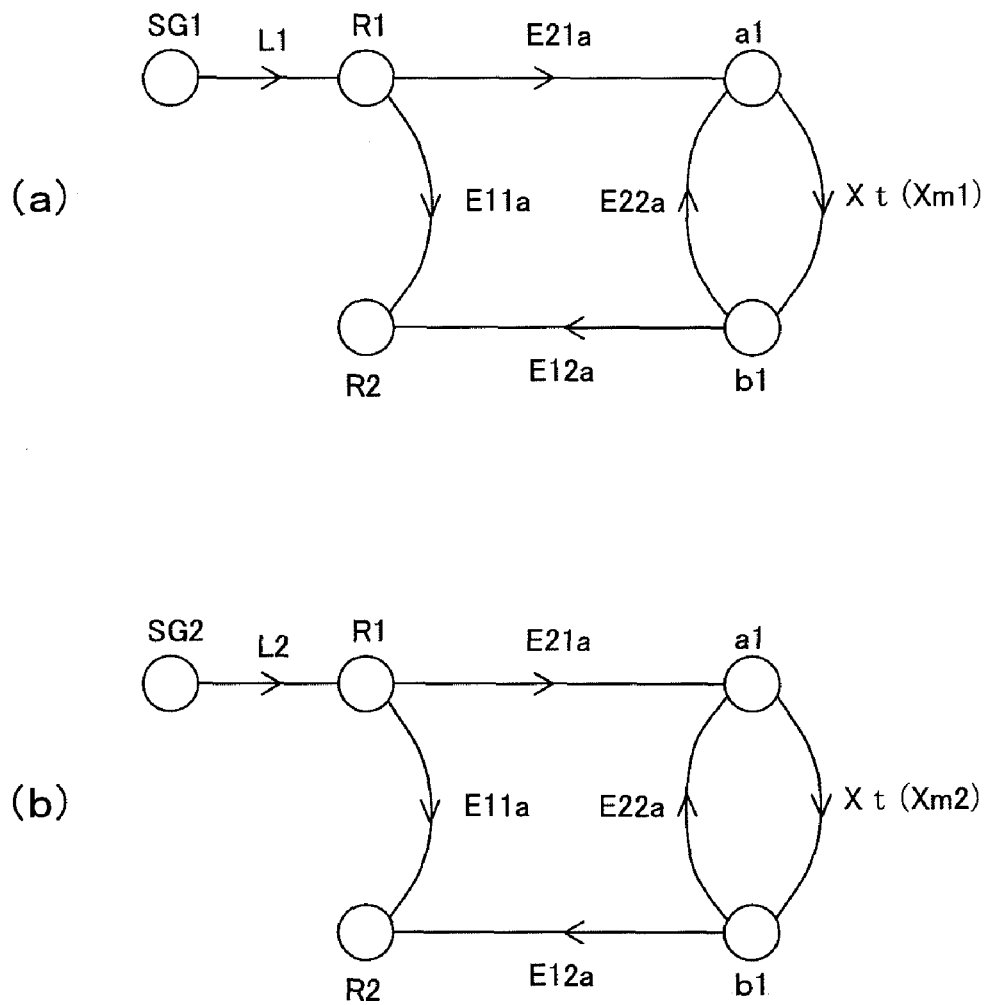
FIG. 19(a) is a signal flow graph representing the error factor determination device 20 in the state shown in FIG. 17.
FIG. 19(b) is a signal flow graph representing the error factor determination device 20 in the state shown in FIG. 18.

FIGS. 19(a) and 19(b) are signal flow graphs representing the error factor determination device 20 in the states respectively shown in FIGS. 17 and 18.

Moreover, FIGS. 17 and 18 show the example in which the calibration tool 62 is attached to the output terminal 19a. However, none may be connected to the output terminal 19a (non-connection state). The non-connection state is realized more easily than the case in which the calibration tool 62 is connected, and the non-connection state is more preferably realized. It should be noted that the change in phase caused by the reflection is zero in the non-connection state. The calibration tool 62 is the same as that of the first embodiment, and hence description thereof is omitted.

It should be noted that the state of the output terminal 19a in which the signal generation unit 12a is connected to the amplifier 13 and the state of the output terminal 19a in which the signal generation unit 12b is connected to the amplifier 13 are the same.

For example, when the signal generation unit 12a is connected to the amplifier 13, the calibration tool 62 is connected to the output terminal 19a. In this case, also when the signal generation unit 12b is connected to the amplifier 13, the calibration tool 62 (or a calibration tool having the same reflection coefficient as the calibration tool 62) is to be connected to the output terminal 19a.

For example, when the signal generation unit 12a is connected to the amplifier 13, none is connected to the output terminal 19a. In this case, when the signal generation unit 12b is connected to the amplifier 13, none is connected to the output terminal 19a.

The true/false determination unit 28 determines whether the error factors Eija recorded in the error factor recording unit 22 are true or false based on whether the reflection coefficients Xm1 and Xm2 derived by the reflection coefficient deriving unit 24 coincide with each other.

Specifically, if Xm1 and Xm2 coincide with each other, the true/false determination unit 28 determines that the error factors Eija are true. The true/false determination unit 28, upon determining the error factors Eija are false, advises a measurement of the error factors Eija or reports a failure of the signal generation system 100.

For example, even if the true/false determination unit 28 determines that the error factors Eija are false, but a difference between Xm1 and Xm2 is within a predetermined range, the true/false determination unit 28 determines that this is caused by a secular change of the signal generation system 100, and advises the measurement of the error factors Eija.

Moreover, for example, if the true/false determination unit 28 determines that the error factors Eija are false, and the difference between Xm1 and Xm2 exceeds the predetermined range, the true/false determination unit 28 determines that this is caused by a failure of the signal generation system 100, and reports so.

It should be noted that the case in which Xm1 and Xm2 coincide with each other implies a case in which Xm1=Xm2. However, even if the relationship: Xm1=Xm2 does not hold, but the difference between Xm1 and Xm2 is within a permissible range, it is considered that Xm1 and Xm2 coincide with each other.

Figure 26:
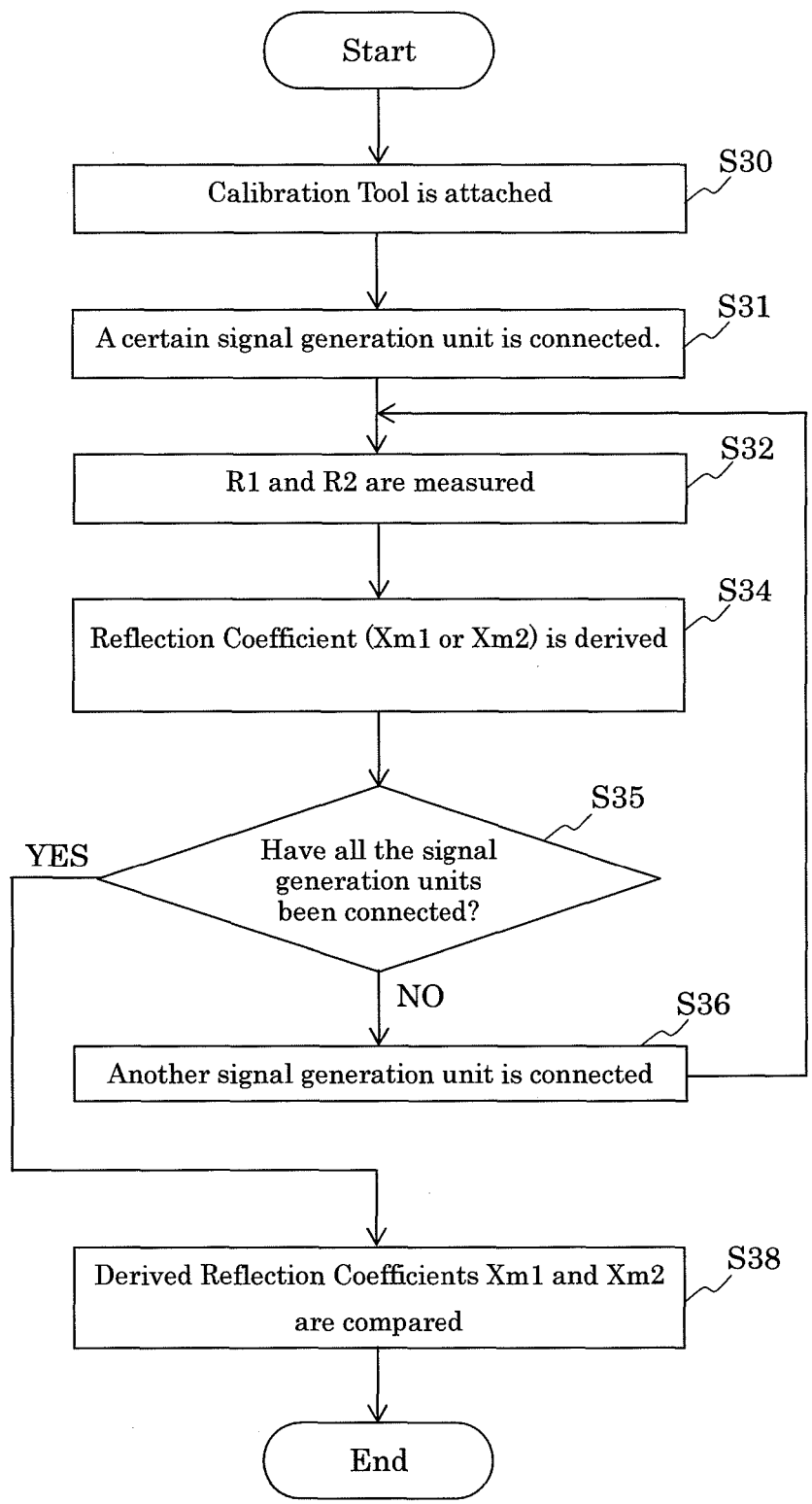
FIG. 26 is a flowchart showing an operation of the error factor determination device 20 according to the third embodiment.
Figure 27:
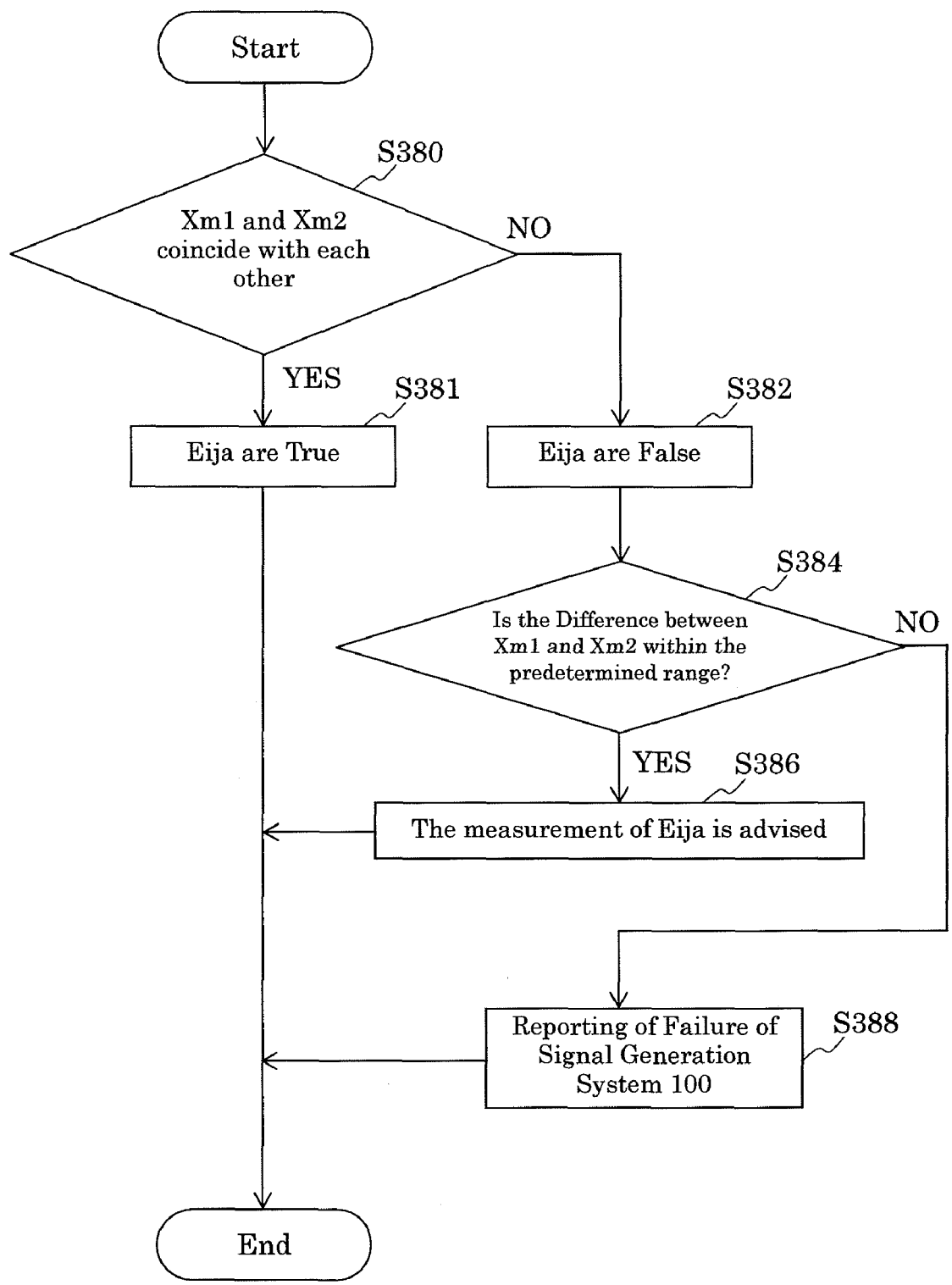
FIG. 27 is a flowchart showing an operation of the true/false determination unit 28 of the error factor determination device 20 according to the third embodiment.

A description will now be given of an operation of the third embodiment with reference to flowcharts in FIGS. 26 and 27. FIG. 26 is a flowchart showing an operation of the error factor determination device 20 according to the third embodiment. FIG. 27 is a flowchart showing an operation of the true/false determination unit 28 of the error factor determination device 20 according to the third embodiment.

First, the calibration tool 62 is attached to the output terminal 19a of the signal generation system 100 (S30). Moreover, the mixer 16a of the signal generation system 100 is connected to the terminal 21a of the error factor determination device 20, and the mixer 16b of the signal generation system 100 is connected to the terminal 21b of the error factor determination device 20.

Further, the switch 11 connects a certain signal generation unit (such as the signal generation unit 12a) to the amplifier 13 (S31).

FIG. 17 shows the state in which the calibration tool 62 is connected to the output terminal 19a, the mixers 16a and 16b are respectively connected to the terminals 21a and 21b, and the signal generation unit 12a is connected to the amplifier 13. It should be noted that components other than the terminals 21a and 21b of the error factor determination device 20, and the reflection coefficient deriving unit 24 are not shown in FIG. 17. R1 is a measurement result of the signal before the error factors Eija are generated. R2 is the measurement result of the reflected signal. R1 and R2 are the measurement results of the signal.

It should be noted that the reflected signal is a resulting signal (b1) which is the signal (a1) output from the output terminal 19a and then reflected by the calibration tool 62. Moreover, the signal (b1) reflected by the calibration tool 62 is fed to the bridge 14b via the switch 18. The reflected signal fed to the bridge 14b is fed to the mixer 16b, and is multiplied by the local signal. The output of the mixer 16b is R2.

Moreover, the signal before the error factors Eija are generated is fed to the bridge 14a. The signal fed to the bridge 14a is fed to the mixer 16a, and is multiplied by the local signal. The output of the mixer 16a is R1.

In this way, R1 and R2 are measured (S32).

The measured outputs R1 and R2 are fed to the reflection coefficient deriving unit 24.

FIG. 19(a) is a signal flow graph representing the error factor determination device 20 in the state shown in FIG. 17. In FIG. 19(a), the above equation (1) holds. It should be noted that X denotes the load coefficient of the calibration tool 62. The above equation (2) is obtained by solving the equation (1) in terms of X.

The reflection coefficient deriving unit 24 assigns the measurement results R1 and R2 of the signal to the equation (2). Moreover, the reflection coefficient deriving unit 24 reads the error factors Eija recorded in the error factor recording unit 22, and assigns the read error factors Eija to the equation (2). As a result, the reflection coefficient deriving unit 24 derives the load factor of the calibration tool 62, namely, the reflection coefficient X of the output terminal 19a (S34).

The derived reflection coefficient X is Xm1, as described above.

Then, until all the signal generation units 12a and 12b have been connected to the amplifier 13 ("YES" in a step S35), another signal generation unit is connected to the amplifier 13 (S36).

For example, switch 11 connects another signal generation unit (such as signal generation unit 12b) to the amplifier 13.

FIG. 18 shows the state in which the calibration tool 62 is connected to the output terminal 19a, the mixers 16a and 16b are respectively connected to the terminals 21a and 21b, and the signal generation unit 12b is connected to the amplifier 13. It should be noted that components other than the terminals 21a and 21b of the error factor determination device 20, and the reflection coefficient deriving unit 24 are not shown in FIG. 18. R1 is a measurement result of the signal before the error factors Eija are generated. R2 is the measurement result of the reflected signal. R1 and R2 are the measurement results of the signal.

It should be noted that the reflected signal is a resulting signal (b1) which is the signal (a1) output from the output terminal 19a and then reflected by the calibration tool 62. Moreover, the signal (b1) reflected by the calibration tool 62 is fed to the bridge 14b via the switch 18. The reflected signal fed to the bridge 14b is fed to the mixer 16b, and is multiplied by the local signal. The output of the mixer 16b is R2.

Moreover, the signal before the error factors Eija are generated is fed to the bridge 14a. The signal fed to the bridge 14a is fed to the mixer 16a, and is multiplied by the local signal. The output of the mixer 16a is R1.

In this way, R1 and R2 are measured (S32).

The measured outputs R1 and R2 are fed to the reflection coefficient deriving unit 24.

FIG. 19(b) is a signal flow graph representing the error factor determination device 20 in the state shown in FIG. 18. In FIG. 19(b), the above equation (1) holds. It should be noted that X denotes the load coefficient of the calibration tool 62. The above equation (2) is obtained by solving the equation (1) in terms of X.

The reflection coefficient deriving unit 24 assigns the measurement results R1 and R2 of the signal to the equation (2). Moreover, the reflection coefficient deriving unit 24 reads the error factors Eija recorded in the error factor recording unit 22, and assigns the read error factors Eija to the equation (2). As a result, the reflection coefficient deriving unit 24 derives the load factor of the calibration tool 62, namely, the reflection coefficient X of the output terminal 19a (S34).

The derived reflection coefficient X is Xm2, as described above.

In this way, if all the signal generation units 12a and 12b have been connected to the amplifier 13 ("YES" in the step S35), the derived reflection coefficients Xm1 and Xm2 are compared with each other by the true/false determination unit 28 (S38).

It should be noted that the derived reflection coefficients Xm1 and Xm2 are fed to the true/false determination unit 28.

The measurement results R1 and R2 of the signal were acquired for the single output terminal 19a. The derived reflection coefficients Xm1 and Xm2 are supposed to coincide with the real value Xt of the output terminal 19a. Thus, Xm1 and Xm2 are supposed to coincide with each other (Xm1=Xm2).

If Xm1 and Xm2 do not coincide with each other, it can be considered that the error factors Eija recorded in the error factor recording unit 22 are false. In other words, the error factors Eija recorded in the error factor recording unit 22 do not coincide with the error factors Eija of the signal generation system 100 when the signal was measured. It is considered that this phenomenon is caused by a secular change or a failure of the signal generation system 100, for example.

Thus, it can be determined whether the error factors Eija recorded in the error factor recording unit 22 are true or false based on whether Xm1 and Xm2 coincide with each other.

If the true value Xt of the reflection coefficient was known before the measurement of the signal, it can also be determined whether the error factors Eija recorded in the error factor recording unit 22 are true or false based on whether Xm1 coincides with Xt, and whether Xm2 coincides with Xt. The above description is given of the application of the idea of the first embodiment to the signal generation system 100 according to the third embodiment.

The third embodiment is different from the first embodiment in that it is not necessary to know the true value Xt of the reflection coefficient.

A description will now be given of an operation of the true/false determination unit 28 with reference to the flowchart in FIG. 27.

The true/false determination unit 28 determines whether the derived reflection coefficients Xm1 and Xm2 coincide with each other (S380). If Xm1 and Xm2 coincide with each other ("YES" in the step S380), the true/false determination unit 28 determines that the error factors Eija recorded in the error factor recording unit 22 are true (S381).

If Xm1 and Xm2 do not coincide with each other ("NO" in the step S380), the true/false determination unit 28 determines that the error factors Eija recorded in the error factor recording unit 22 are false (S382).

On this occasion, even if Xm1 and Xm2 do not coincide with each other, but the difference between Xm1 and Xm2 is within the predetermined range ("YES" in a step S384), the true/false determination unit 28 determines that the difference is caused by a secular change of the signal generation system 100, and advises the measurement of the error factors Eija (S386). For example, a display (not shown) of the error factor determination device 20 is caused to show a message advising the measurement of the error factors Eija ("Calibrate signal generation system", for example).

If Xm1 and Xm2 do not coincide with each other, and the difference between Xm1 and Xm2 is not within the predetermined range ("NO" in the step S384), the true/false determination unit 28 determines that the signal generation system 100 has failed, and reports so (S388). For example, the true/false determination unit 28 causes the display (not shown) of the error factor determination device 20 to show a message ("Signal generation system has failed", for example).

A description will now be given of an operation of determination whether the amplification factor of the amplifier 13 recorded in the amplification factor recording unit 25 is true or false.

The attachment of the calibration tool 62 (S30), the connection of the signal generation units (S31 and S36) and the measurement of R1 and R2 (S32) are carried out as described above. Then, the powers SG1 and SG2 of the signal and the measured R1 are fed to the amplification factor deriving unit 23. The amplification factor deriving unit 23 derives the amplification factor L1 as: L1=R1/SG1, and the amplification factor L2 as: L2=R1/SG2. Then, the amplification factor true/false determination unit 29 determines whether the recorded amplification factor is true or false based on the amplification factor recorded in the amplification factor recording unit 25 and the amplification factor derived by the amplification factor deriving unit 23.

According to the third embodiment, it is possible to determine whether the error factors Eija recorded in the error factor recording unit 22 are true or false by measuring R1 and R2 while the calibration tool 62 is connected to the output terminal 19a, or none is connected to the output terminal 19a (non-connection state). Moreover, the determination can be made even if the true value Xt of the reflection coefficient of the output terminal 19a is not known.

In other words, since it is possible to determine whether the error factors Eija recorded in the error factor recording unit 22 are true or false without measuring the error factors Eija while the three states: open, short-circuit, load (standard load Z0) are realized on the output terminal 19a, and, further, connecting a power meter, it is easy to determine whether the error factors Eija are true or false.

If it is determined that the error factors Eija are true, the error factors Eija recorded in the error factor recording unit 22 can be used as the error factors of the signal generation system 100. Since it is not necessary to measure the error factors Eija, it is possible to reduce the labor required for the calibration.

Moreover, if it is determined that the error factors Eija are false, it is necessary to measure the error factors of the signal generation system 100. However, since it is not necessary to measure the error factors each time when circuit parameters of a device under test are measured, it is possible to reduce the labor required for the calibration.

A description will now be given of an example of application forms of the error factor determination device 20.

Figure 20:
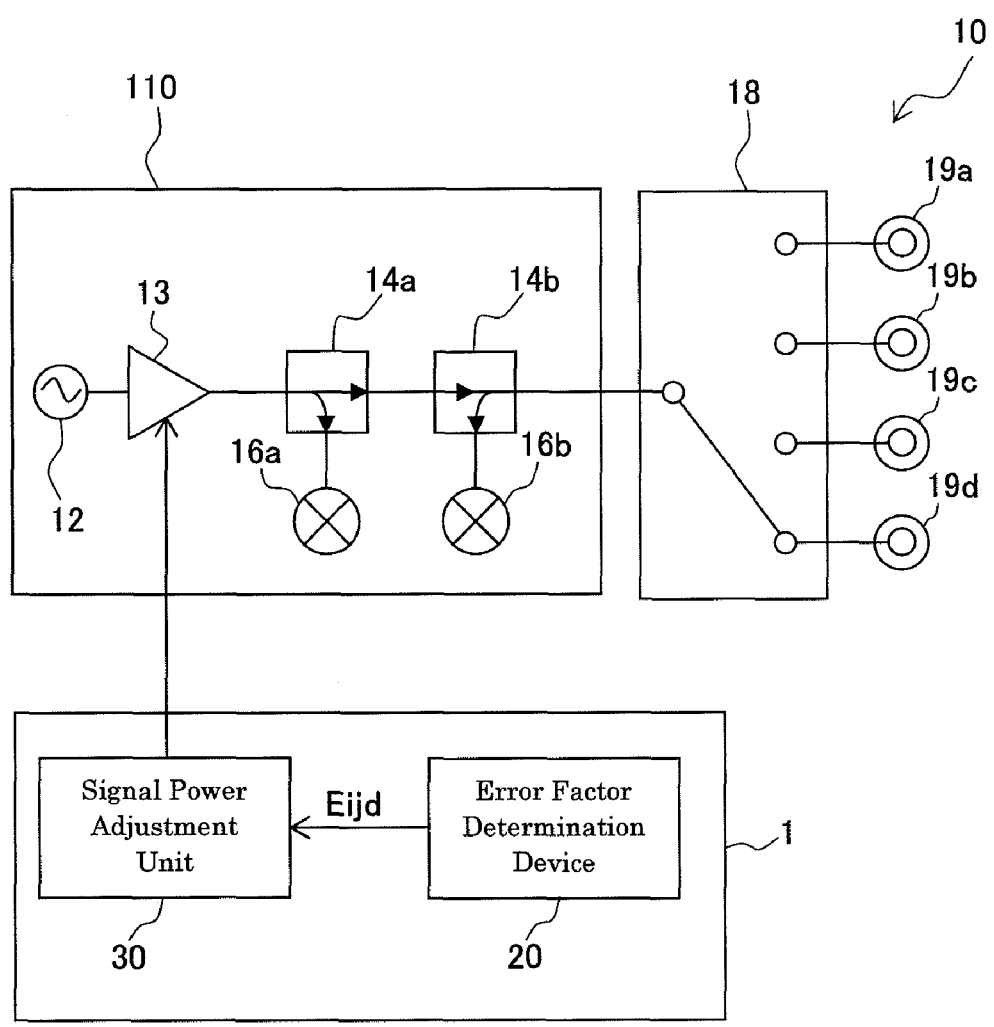
FIG. 20 shows an example of a configuration of an output correction device 1 when the error factor determination device 20 is used as the output correction device 1.

FIG. 20 shows an example of a configuration of an output correction device 1 when the error factor determination device 20 is used as the output correction device 1.

A signal is to be output from the output terminal 19d of the switch-branch signal source 10 according to the second embodiment. Moreover, the power of this signal is to be adjusted to a target. On this occasion, it is necessary to adjust the gain of the amplifier 13 in consideration of the influence of the fourth port error factors Eijd.

The output correction device 1 includes the error factor determination device 20 and a signal power adjustment unit 30. The detailed description of the error factor determination device 20 has been given, and the error factor determination device 20 reads the fourth port error factors Eijd from the error factor recording unit 22, and feeds the read fourth port error factors Eijd to the signal power adjustment unit 30. It should be noted that the fourth port error factors Eijd have been determined as true by the true/false determination unit 28.

The signal power adjustment unit 30 adjusts the power of the signal based on the fourth port error factors Eijd fed by the error factor determination device 20. For example, the signal power adjustment unit 30 adjusts the power of the signal by adjusting the gain of the amplifier 13, for example. This adjustment can adjust the power of the signal output from the output terminal 19d to a target.

It should be noted that it is necessary to feed the first port error factors Eija from the error factor determination device 20 to the signal power adjustment unit 30 in order to adjust the power of the signal output from the output terminal 19a to the target. The signal power adjustment unit 30 adjusts the power of the signal based on the first port error factors Eija fed by the error factor determination device 20. The error factor determination device 20 reads the first port error factors Eija from the error factor recording unit 22, and feeds the read first port error factors Eija to the signal power adjustment unit 30. It should be noted that the first port error factors Eija have been determined as true by the true/false determination unit 28.

It should be noted that it is necessary to feed the second port error factors Eijb from the error factor determination device 20 to the signal power adjustment unit 30 in order to adjust the power of the signal output from the output terminal 19b to the target. The signal power adjustment unit 30 adjusts the power of the signal based on the second port error factors Eijb fed by the error factor determination device 20. The error factor determination device 20 reads the second port error factors Eijb from the error factor recording unit 22, and feeds the read second port error factors Eijb to the signal power adjustment unit 30. It should be noted that the second port error factors Eijb have been determined as true by the true/false determination unit 28.

It should be noted that it is necessary to feed the third port error factors Eijc from the error factor determination device 20 to the signal power adjustment unit 30 in order to adjust the power of the signal output from the output terminal 19c to the target. The signal power adjustment unit 30 adjusts the power of the signal based on the third port error factors Eijc fed by the error factor determination device 20. The error factor determination device 20 reads the third port error factors Eijc from the error factor recording unit 22, and feeds the read third port error factors Eijc to the signal power adjustment unit 30. It should be noted that the third port error factors Eijc have been determined as true by the true/false determination unit 28.

A description will now be given of a case in which, in place of the switch-branch signal source 10 according to the second embodiment, the power of the signal output from the signal generation system 100 according to the first and third embodiments is to be adjusted to a target. On this occasion, it is necessary to adjust the gain of the amplifier 13 in consideration of the influence of the first port error factors Eija. Also in this case, the configuration of the output correction device 1 is the same as that described above. The signal power adjustment unit 30 adjusts the power of the signal based on the first port error factors Eija fed by the error factor determination device 20. The error factor determination device 20 reads the first port error factors Eija from the error factor recording unit 22, and feeds the read first port error factors Eija to the signal power adjustment unit 30. It should be noted that the first port error factors Eija have been determined as true by the true/false determination unit 28.

Figure 21:
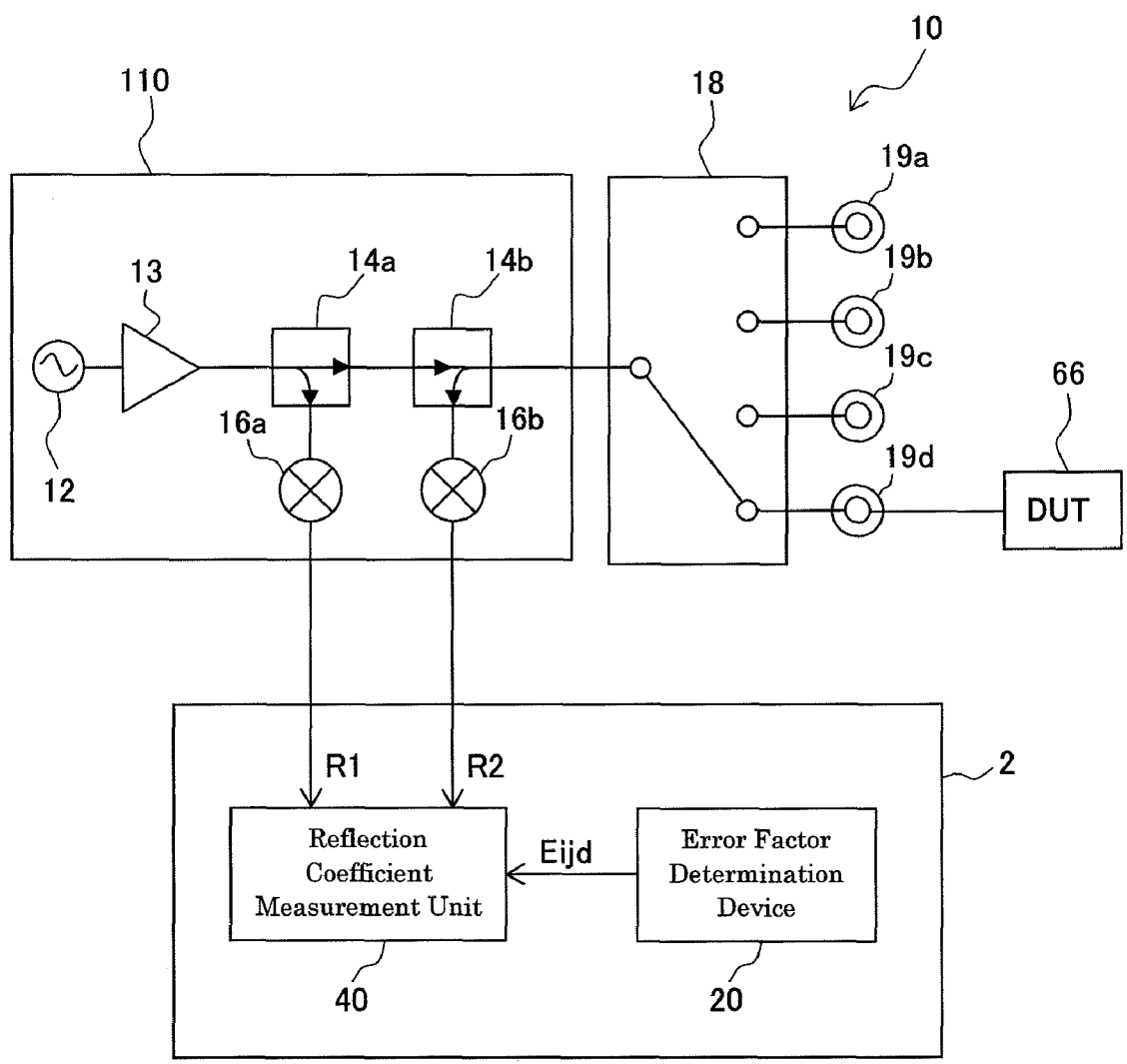
FIG. 21 shows an example of a configuration of a reflection coefficient measurement device 2 when the error factor determination device 20 is applied to the reflection coefficient measurement device 2.

FIG. 21 shows an example of a configuration of a reflection coefficient measurement device 2 when the error factor determination device 20 is applied to the reflection coefficient measurement device 2.

It is assumed that a device under test (DUT) 66 is connected to the output terminal 19d of the switch-branch signal source 10 in order to measure the reflection coefficient of the DUT 66. It is possible to acquire the reflection coefficient of the DUT 66 based on R1 and R2. On this occasion, it is necessary to acquire the reflection coefficient in consideration of the influence of the fourth port error factors Eijd.

The reflection coefficient measurement device 2 includes the error factor determination device 20 and a reflection coefficient measurement unit 40. The detailed description of the error factor determination device 20 has been given, and the error factor determination device 20 reads the fourth port error factors Eijd from the error factor recording unit 22, and feeds the read fourth port error factors Eijd to the reflection coefficient measurement unit 40. It should be noted that the fourth port error factors Eijd have been determined as true by the true/false determination unit 28.

The reflection coefficient measurement unit 40 measures the reflection coefficient of the DUT 66 based on a result R1 of the measurement of the signal before the fourth port error factors Eijd are generated, a result R2 of the measurement of the signal resulting from the signal reflected by the DUT 66 (the signal resulting from the signal reflected by the DUT 66 is fed to the mixer 16b via the switch 18 and the bridge 14b), and the fourth port error factors Eijd fed by the error factor determination device 20.

In order to measure the reflection coefficient of the DUT 66 connected to the output terminal 19a, the first port error factors Eija are to be fed from the error factor determination device 20 to the reflection coefficient measurement unit 40. The reflection coefficient measurement unit 40 measures the reflection coefficient of the DUT 66 based on R1 and R2, and the first port error factors Eija fed by the error factor determination device 20. The error factor determination device 20 reads the first port error factors Eija from the error factor recording unit 22, and feeds the read first port error factors Eija to the reflection coefficient measurement unit 40. It should be noted that the first port error factors Eija have been determined as true by the true/false determination unit 28.

In order to measure the reflection coefficient of the DUT 66 connected to the output terminal 19b, the second port error factors Eijb are to be fed from the error factor determination device 20 to the reflection coefficient measurement unit 40. The reflection coefficient measurement unit 40 measures the reflection coefficient of the DUT 66 based on R1 and R2, and the second port error factors Eijb fed by the error factor determination device 20. The error factor determination device 20 reads the second port error factors Eijb from the error factor recording unit 22, and feeds the read second port error factors Eijb to the reflection coefficient measurement unit 40. It should be noted that the second port error factors Eijb have been determined as true by the true/false determination unit 28.

In order to measure the reflection coefficient of the DUT 66 connected to the output terminal 19c, the third port error factors Eijc are to be fed from the error factor determination device 20 to the reflection coefficient measurement unit 40. The reflection coefficient measurement unit 40 measures the reflection coefficient of the DUT 66 based on R1 and R2, and the third port error factors Eijc fed by the error factor determination device 20. The error factor determination device 20 reads the third port error factors Eijc from the error factor recording unit 22, and feeds the read third port error factors Eijc to the reflection coefficient measurement unit 40. It should be noted that the third port error factors Eijc have been determined as true by the true/false determination unit 28.

A description will now be given of a case in which, in place of the switch-branch signal source 10 according to the second embodiment, the device under test (DUT) 66 is connected to the output terminal 19a of the signal generation system 100 according to the first and third embodiments, and the reflection coefficient of the DUT 66 is to be measured. On this occasion, it is necessary to acquire the reflection coefficient in consideration of the influence of the first port error factors Eija. Also in this case, the configuration of the reflection coefficient measurement device 2 is the same as that described above. The reflection coefficient measurement unit 40 measures the reflection coefficient of the DUT 66 based on R1 and R2, and the first port error factors Eija fed by the error factor determination device 20. The error factor determination device 20 reads the first port error factors Eija from the error factor recording unit 22, and feeds the read first port error factors Eija to the reflection coefficient measurement unit 40. It should be noted that the first port error factors Eija have been determined as true by the true/false determination unit 28.

In the above embodiments, the description has been given of the case which has only one of the signal generation system 100 (first and third embodiments) or only one of the switch-branch signal source 10 (second embodiment). However, even if there are two or more of the signal generation systems 100, the error factor determination device 20 according to the above embodiments may be connected to the respective signal generation systems 100 and may be used. Moreover, even if there are two or more of the switch-branch signal sources 10, the error factor determination device 20 according to the above embodiment may be connected to the respective switch-branch signal sources 10 and may be used.

Moreover, the above-described embodiment may be realized in the following manner. A computer is provided with a CPU, a hard disk, and a media (such as a floppy disk (registered trade mark) and a CD-ROM) reader, and the media reader is caused to read a medium recording a program which realizes the above-described respective components (such as the error factor determination device 20), thereby installing the program on the hard disk. This method may also realize the above-described functions.

The invention claimed is:

1. An error factor determination device comprising:
    an error factor recorder that records an error factor in a signal generation system which comprises a signal generation unit for generating a signal, and an output terminal for outputting the signal;
    a reflection coefficient deriver that derives a reflection coefficient of the output terminal based on a measurement result of the signal while the signal is being output from the output terminal, and the error factor recorded in the error factor recorder; and
    a true/false determiner that determines whether the recorded error factor is true or false based on the derived reflection coefficient, and a true value of the reflection coefficient.

2. The error factor determination device according to claim 1, wherein the measurement result of the signal includes a measurement result of the signal before the error factor is generated and a measurement result of a reflection of the signal.

3. The error factor determination device according to claim 1, wherein:
the signal is measured while a calibration tool is connected to the output terminal; and
the calibration tool realizes any of states including an open state, a short-circuit state, a standard load state, and an arbitrary load state.

4. The error factor determination device according to claim 1, wherein the signal generation system comprises an amplifier which amplifies the signal, comprising:
an amplification factor recorder which records an amplification factor of the amplifier;
an amplification factor deriver that derives the amplification factor based on the measurement result of the signal while the signal is being output from the output terminal and a power of the signal; and
an amplification factor true/false determiner that determines whether the recorded amplification factor is true or false based on the recorded amplification factor and the derived amplification factor.

5. The error factor determination device according to claim 1, wherein the true/false determiner advises a measurement of the error factor, or reports a failure of the signal generation system based on a result of determining whether the recorded error factor is true or false.

6. An output correction device comprising:
the error factor determination device according to claim 1; and
a signal power adjuster that adjusts a power of the signal based on the error factor determined as true by the true/false determiner.

7. A reflection coefficient measurement device comprising:
the error factor determination device according to claim 1; and
a reflection coefficient measurer that measures a reflection coefficient of a device under test based on a result of a measurement of the signal before the error factor is generated, a result of a measurement of a reflection of the signal, and the error factor determined as true by the true/false determiner while the device under test is connected to the output terminal.

8. An error factor determination device comprising:
an error factor recorder that records an error factor in a signal generation system which comprises a signal generation unit for generating a signal and a plurality of output terminals for outputting the signal;
a reflection coefficient deriver that derives respective reflection coefficients of the plurality of output terminals based on a measurement result of the signal while the signal is being output from the output terminal, and the error factor recorded in the error factor recorder; and
a true/false determiner that determines whether the recorded error factor is true or false based on the derived reflection coefficients coincide with each other,
wherein the measurement result of the signal is acquired when the respective reflection coefficients of the plurality of the output terminals coincide with each other.

9. The error factor determination device according to claim 8, wherein:
the plurality of output terminals are of the same type; and
the signal is measured while the plurality of output terminals are in a non-connection state.

10. The error factor determination device according to claim 8, wherein:
the signal is measured while the same calibration tool is connected to the plurality of output terminals; and
the calibration tool realizes any of states including an open state, a short-circuit state, a standard load state, and an arbitrary load state.

11. An error factor determination device comprising:
an error factor recorder that records an error factor in a signal generation system which comprises a plurality of signal generation units for generating a signal and a single output terminal for outputting the signal;
a reflection coefficient deriver that derives a reflection coefficient of the output terminal respectively for the plurality of signal generation units based on a measurement result of the signal while the signal is being output from the output terminal, and the error factor recorded in the error factor recorder; and
a true/false determiner that determines whether the recorded error factor is true or false based on the derived reflection coefficients coincide with each other.

12. An error factor determination method comprising:
recording an error factor in a signal generation system which comprises a signal generation unit for generating a signal, and an output terminal for outputting the signal;
deriving a reflection coefficient of the output terminal based on a measurement result of the signal while the signal is being output from the output terminal, and the error factor recorded in the error factor recording; and
determining whether the recorded error factor is true or false based on the derived reflection coefficient, and a true value of the reflection coefficient.

13. An error factor determination method comprising:
recording an error factor in a signal generation system which comprises a signal generation unit for generating a signal and a plurality of output terminals for outputting the signal;
deriving respective reflection coefficients of the plurality of output terminals based on a measurement result of the signal while the signal is being output from the output terminal, and the error factor recorded in the error factor recording; and
determining whether the recorded error factor is true or false based on the derived reflection coefficients coincide with each other,
wherein the measurement result of the signal is acquired when the respective reflection coefficients of the plurality of the output terminals coincide with each other.

14. An error factor determination method comprising:
recording an error factor in a signal generation system which comprises a plurality of signal generation units for generating a signal and a single output terminal for outputting the signal;
deriving a reflection coefficient of the output terminal respectively for the plurality of signal generation units based on a measurement result of the signal while the signal is being output from the output terminal, and the error factor recorded in the error factor recording; and
determining whether the recorded error factor is true or false based on the derived reflection coefficients coincide with each other.

15. A program of instructions for execution by the computer to perform an error factor determination process comprising:
recording an error factor in a signal generation system which comprises a signal generation unit for generating a signal, and an output terminal for outputting the signal;
deriving a reflection coefficient of the output terminal based on a measurement result of the signal while the signal is being output from the output terminal, and the error factor recorded in the error factor recording; and determining whether the recorded error factor is true or false based on the derived reflection coefficient, and a true value of the reflection coefficient.

16. A program of instructions for execution by the computer to perform an error factor determination process comprising:

recording an error factor in a signal generation system which comprises a signal generation unit for generating a signal and a plurality of output terminals for outputting the signal;

deriving respective reflection coefficients of the plurality of output terminals based on a measurement result of the signal while the signal is being output from the output terminal, and the error factor recorded in the error factor recording; and determining whether the recorded error factor is true or false based on the derived reflection coefficients coincide with each other, wherein the measurement result of the signal is acquired when the respective reflection coefficients of the plurality of the output terminals coincide with each other.

17. A program of instructions for execution by the computer to perform an error factor determination process comprising:

recording an error factor in a signal generation system which comprises a plurality of signal generation units for generating a signal and a single output terminal for outputting the signal;

deriving a reflection coefficient of the output terminal respectively for the plurality of signal generation units based on a measurement result of the signal while the signal is being output from the output terminal, and the error factor recorded in the error factor recording; and determining whether the recorded error factor is true or false based on the derived reflection coefficients coincide with each other.

18. A computer-readable medium having a program of instructions for execution by the computer to perform an error factor determination process comprising:

recording an error factor in a signal generation system which comprises a signal generation unit for generating a signal, and an output terminal for outputting the signal;

deriving a reflection coefficient of the output terminal based on a measurement result of the signal while the signal is being output from the output terminal, and the error factor recorded in the error factor recording; and determining whether the recorded error factor is true or false based on the derived reflection coefficient, and a true value of the reflection coefficient.

19. A computer-readable medium having a program of instructions for execution by the computer to perform an error factor determination process comprising:

recording an error factor in a signal generation system which comprises a signal generation unit for generating a signal and a plurality of output terminals for outputting the signal;

deriving respective reflection coefficients of the plurality of output terminals based on a measurement result of the signal while the signal is being output from the output terminal, and the error factor recorded in the error factor recording; and determining whether the recorded error factor is true or false based on the derived reflection coefficients coincide with each other, wherein the measurement result of the signal is acquired when the respective reflection coefficients of the plurality of the output terminals coincide with each other.

20. A computer-readable medium having a program of instructions for execution by the computer to perform an error factor determination process comprising:

recording an error factor in a signal generation system which comprises a plurality of signal generation units for generating a signal and a single output terminal for outputting the signal;

deriving a reflection coefficient of the output terminal respectively for the plurality of signal generation units based on a measurement result of the signal while the signal is being output from the output terminal, and the error factor recorded in the error factor recording; and determining whether the recorded error factor is true or false based on the derived reflection coefficients coincide with each other.

* * * * *